(12) United States Patent
Lemar et al.

(10) Patent No.: US 9,053,114 B1
(45) Date of Patent: Jun. 9, 2015

(54) EXTENSIBLE DATA PATH

(71) Applicant: Igneous Systems, Inc., Seattle, WA (US)

(72) Inventors: Eric Michael Lemar, Seattle, WA (US); Triantaphyllos Byron Rakitzis, Seattle, WA (US); Kiran V. Bhageshpur, Seattle, WA (US); Jeffrey Douglas Hughes, Seattle, WA (US)

(73) Assignee: Igneous Systems, Inc., Seattle, WA (US)

( * ) Notice: Subject to any disclaimer, the term of this patent is extended or adjusted under 35 U.S.C. 154(b) by 0 days.

(21) Appl. No.: 14/454,651

(22) Filed: Aug. 7, 2014

(51) Int. Cl.
*G06F 12/00* (2006.01)
*G06F 17/30* (2006.01)
*G06F 12/08* (2006.01)
*G06F 3/06* (2006.01)
*G11C 7/10* (2006.01)

(52) U.S. Cl.
CPC ...... *G06F 17/30091* (2013.01); *G06F 12/0802* (2013.01); *G06F 3/0604* (2013.01); *G06F 3/0643* (2013.01); *G06F 3/067* (2013.01); *G06F 17/30132* (2013.01); *G06F 12/0831* (2013.01); *G11C 7/1039* (2013.01); *G06F 12/0817* (2013.01)

(58) Field of Classification Search
None
See application file for complete search history.

(56) References Cited

U.S. PATENT DOCUMENTS

| | | | |
|---|---|---|---|
| 6,615,314 B1 | 9/2003 | Higaki et al. | |
| 6,647,514 B1 | 11/2003 | Umberger et al. | |
| 7,305,579 B2 | 12/2007 | Williams | |
| 7,451,344 B1 | 11/2008 | Rothberg | |
| 8,006,128 B2 | 8/2011 | Olster | |
| 8,438,420 B1 | 5/2013 | Dutch et al. | |
| 8,751,739 B1 | 6/2014 | Bjornsson | |
| 8,751,861 B2 | 6/2014 | Nair et al. | |
| 8,850,108 B1 | 9/2014 | Hayes et al. | |
| 2006/0015771 A1 | 1/2006 | Van Gundy et al. | |
| 2006/0190683 A1 | 8/2006 | Takase | |
| 2007/0220313 A1 | 9/2007 | Katsuragi et al. | |
| 2008/0126844 A1 | 5/2008 | Morita et al. | |
| 2009/0172285 A1* | 7/2009 | Smith et al. | 711/125 |
| 2011/0029809 A1 | 2/2011 | Dhuse et al. | |
| 2011/0289378 A1 | 11/2011 | Grube et al. | |
| 2012/0079317 A1 | 3/2012 | Nelogal et al. | |
| 2012/0303736 A1 | 11/2012 | Novotny et al. | |

(Continued)

OTHER PUBLICATIONS

Office Communication for U.S. Appl. No. 14/550,466 mailed on Feb. 9, 2015 (9 pages).
Office Communication for U.S. Appl. No. 14/315,139 mailed on Dec. 26, 2014.

(Continued)

*Primary Examiner* — Brian Peugh
(74) *Attorney, Agent, or Firm* — John W. Branch; Lowe Graham Jones PLLC

(57) ABSTRACT

Embodiments are directed towards storing data in a storage system using an extensible data path. Data files may be provided to a caching tier in a storage system. If data files remain in the caching tier longer than a time limit, those data files may be removed from the caching tier and provided to a processing pipeline. The processing pipeline may be coupled to a capacity tier of the storage system. Filters to include in the processing pipeline may be determined based on the type of the data files. The data files may be updated based on applying each filter, such that each update corresponding to each filter may be cumulatively applied to each data file. Each updated data file may be stored in the capacity tier of the storage system after each filter in the processing pipeline has been applied.

30 Claims, 13 Drawing Sheets

(56) References Cited

U.S. PATENT DOCUMENTS

| | | | |
|---|---|---|---|
| 2013/0024723 | A1 | 1/2013 | Govindasamy |
| 2013/0054913 | A1 | 2/2013 | Maeda et al. |
| 2013/0290775 | A1 | 10/2013 | Tucek et al. |
| 2014/0101283 | A1 | 4/2014 | Alnafoosi et al. |
| 2014/0365819 | A1 | 12/2014 | Cooper et al. |

OTHER PUBLICATIONS

Office Communication for U.S. Appl. No. 14/272,303 mailed on Dec. 22, 2014.

Office Communication for U.S. Appl. No. 14/315,139 mailed on Sep. 4, 2014.

* cited by examiner

EXTENSIBLE DATA PATH

TECHNICAL FIELD

This invention relates generally to managing data storage in a network, and more particularly, but not exclusively, to techniques for storing data in a data storage system.

BACKGROUND

The growth of the amount of data generated and retained by modern enterprises continues to increase. This explosion in data has led to larger and larger data storage systems. In some cases, these data storage systems may include thousands of storage devices. In some cases, users that have very large data sets may need to organize and/or index their data in ways that may be unique, or otherwise unsupported by the storage system infrastructure. Accordingly, applications that may be separate from the storage system may be employed to retrieve data from the storage system to organize and/or index the data. However, as the size of the data sets continues to increase, using such applications may become prohibitively expensive in time and resources. Thus, it is with respect to these considerations and others that the invention has been made.

DETAILED DESCRIPTION OF THE EMBODIMENTS

Figure 1:
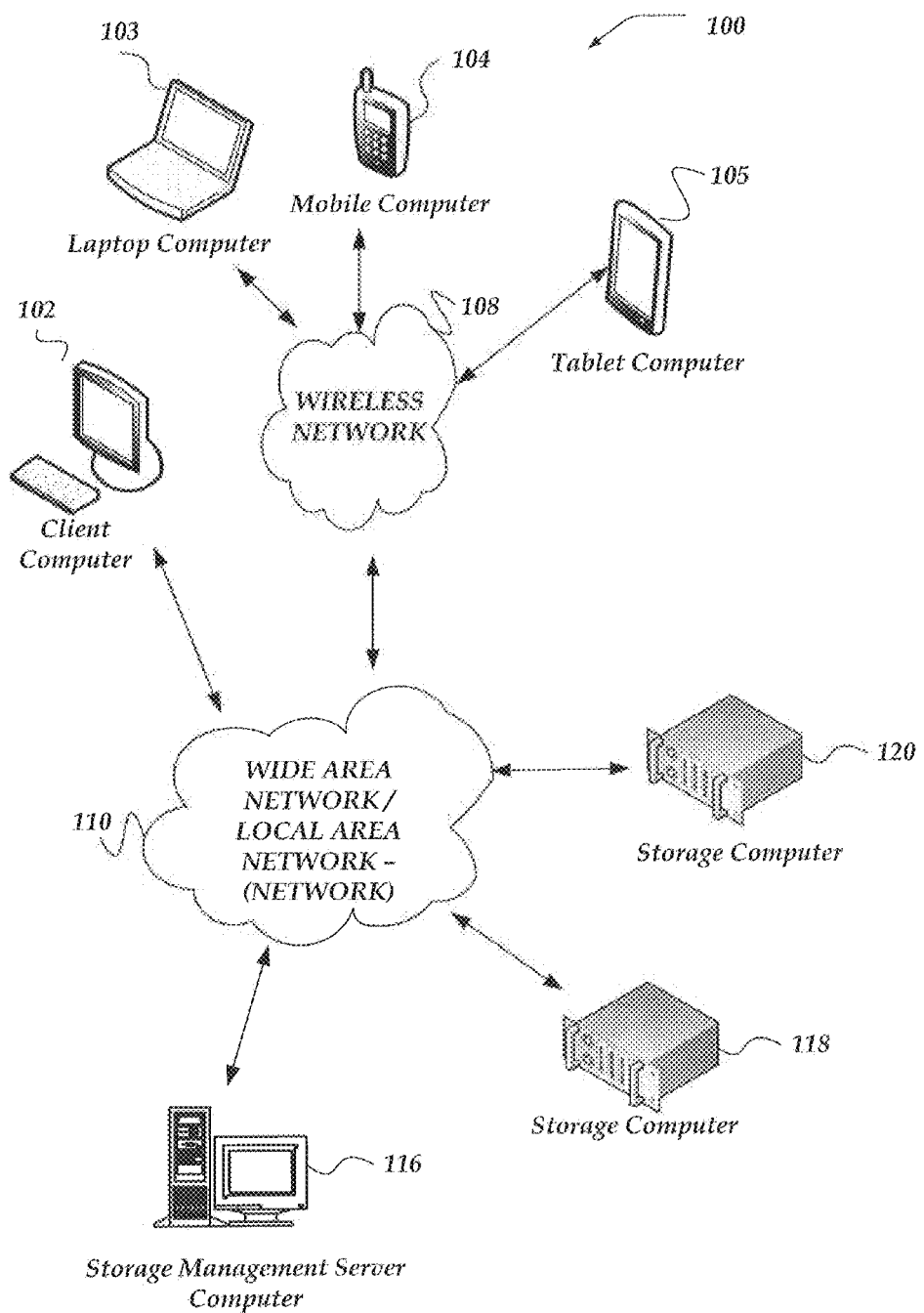
FIG. 1 illustrates a system environment in which various embodiments may be implemented.

Various embodiments now will be described more fully hereinafter with reference to the accompanying drawings, which form a part hereof, and which show, by way of illustration, specific exemplary embodiments by which the invention may be practiced. The embodiments may, however, be embodied in many different forms and should not be construed as limited to the embodiments set forth herein; rather, these embodiments are provided so that this disclosure will be thorough and complete, and will fully convey the scope of the embodiments to those skilled in the art. Among other things, the various embodiments may be methods, systems, media or devices. Accordingly, the various embodiments may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise, The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being bused on additional factors not described, unless the context clearly dictates otherwise. In addition, throughout the specification, the meaning of "a," "an," and "the" include plural references. The meaning of "in" includes "in" and "on."

For example embodiments, the following terms are also used herein according to the corresponding meaning, unless the context clearly dictates otherwise.

The term "storage device" as used herein refers to various apparatus tor digital storing information, generally for use by computers. Storage devices may be fixed or removable non-volatile memory systems, such as, magnetic hard drives, magnetic tape, optical drives, solid state drives (SSD), flash memory storage, or the like. Typically, one or more storage devices may be arranged to store information for use in a computer system.

The term "storage computer" as used herein refers to a computer that is arranged to include one or more storage devices. In at least one of the various embodiments, a storage computer may include several storage devices inside a chassis. In other embodiments, the storage devices may be integrated with the storage computer.

The term "CPU complex" as used herein refers to portion of a computer that generally includes, one or more CPU's, cache memory. RAM, I/O components, or the like. Herein, having one or more CPU complexes at least distinguishes a storage computer from a storage device.

The term "protection level" as used herein refers to the number of simultaneous data failures a storage system may experience before data may be irrevocably lost. In at least one of the various embodiments, protection level may be computed based on the amount of repair symbol information the storage system is storing for each storage unit. For example, if a storage system that employs erasure coding has ten hard drives for data storage and two hard drives for storing repair symbol information, under most arrangements the storage system would be considered to have a protection level of two.

The term "erasure coding" as used herein refers to methods for error correction/error recovery based on computing repair symbol information from storage information. The repair symbol information may be computed and stored separately from the storage information and may be employed to correct errors in the storage information that may be caused by data failure. Likewise, if the repair symbol information is lost because of a storage failure it may be recomputed from the storage information. One of ordinary skill in the art will be familiar with one or more well-known techniques for implementing erasure coding in a computer storage system. One or more well-known erasure coding algorithms may be employed for generating repair symbol information and recovery from data failure, such as, Reed-Solomon coding, XORing, Hamming codes, or the like. Various standard, non-standard, or custom,, erasure coding systems may be used with the prioritized repair, non-limiting examples include, RAID 5 or RAID 6, or the like.

The term "capacity tier" as used herein refers to a portion of a storage system that is arranged for storing large amounts of information. The capacity tier may be arranged to emphasize storage capacity, data protection, scaling, or the like, rather than speed and responsiveness. A storage system may comprise a capacity tier paired with a caching tier. Often, data files may be initially stored on a caching tier before being moved to a capacity tier.

The term "caching tier" as used herein refers to the portion of a storage system that is arranged to provide low latency response to client read and write requests. The caching tier may be arranged to emphasize speed rather than capacity, data protection, or the like. Data files located in a caching tier may eventually be moved to a capacity tier.

The term "data file" as used herein refers to data or information that may he saved to a storage system. A data file includes the information that may he provided by a user or client application for storage in a storage system. Transparent to the writer, a storage system may break the data file into chunks or blocks for storage on one or more storage devices. If a user retrieves a data file from a storage system, the storage system may locate the necessary data blocks to provide the data file to the user. Data files may include any kind of digitally storable data, such as, word processor documents, text tiles, database dumps, spreadsheets, images, sound files, movies, videos, sensor data, log files, markup language documents (e.g., HTML files), XML files, or the like. From the user's perspective, writing a data file to the storage system may be an atomic operation. Thus, either the entire data file is written to stable storage, or it fails. The underlying organization and processes for processing and/or handling the data file may be transparent to a user or application that is storing the data file. Similarly, reading a data file from the storage system may be an atomic operation for the user that comprises several actions that are performed by the storage system.

The term "processing pipeline" as used herein refers to a portion of the storage system that is arranged to process data files using one or more filters. The filters may operate in sequence to cumulatively modify the content of the data file. In at least one of the various embodiments, after the data file has been processed in the processing pipeline it may be stored in a capacity tier of the storage system.

The term "filter" as used herein refers to one or more software or hardware application modules that may be arranged to perform processing on a data file as it progresses through a processing pipeline. Filters may be designed to be executed one after another on the data file. In other embodiments, some filters may designed to operate simultaneously (e.g. in parallel). Executing the operations of a filter on a data file may be considered as applying the fitter to the data file.

Briefly stated, various embodiments are directed towards storing data in a storage system using an extensible data path.

In at least one of the various embodiments, one or more data files may be provided to a caching tier in a storage system. In at least one of the various embodiments, if a duration that one or more data tiles remain in the caching tier exceeds a defined threshold, or if an elapsed time since last access exceeds a defined threshold, those data files may be removed from the caching tier and provided to a processing pipeline. In at least one of the various embodiments, if a data file provided to the caching tier is currently stored in the caching tier, the age of that data file may be reset to new. Also, in at least one of the various embodiments, an acknowledgment indicating that the data file is currently stored in the caching tier may be communicated to the network computer that provided the data file.

In at least one of the various embodiments, the processing pipeline may be coupled to a capacity tier of the storage system. In at least one of the various embodiments, one or more filters to include in the processing pipeline may be determined based on the type of the data files that may be provided to the processing pipeline.

In at least one of the various embodiments, the data files in the processing pipeline may be updated based on applying each determined filter to the data files in the processing pipeline, such that each update that corresponds to each filter may be cumulatively applied to each data file except for one or more filters that may exceed a resource limit during their application to data files. Further, on at least one of the various embodiments, updating the data files based on applying the determined filters may include operations, such as, compressing the data file, encrypting the data file, or the like.

Also, in at least one of the various embodiments, one or more indices may be generated by applying one or more of the determined filters to the data files.

In at least one of the various embodiments, a filter trace that is associated with the data file may he updated to include an identifier and/or other information that corresponds to each filter that may be applied to the data file. Further, in at least one of the various embodiments, each updated data file may be stored in the capacity tier of the storage system after each filter in the processing pipeline has been applied.

In at least one of the various embodiments, responsive to a request to retrieve a data file from the capacity tier of the storage system, filters may be applied in the reverse order from when they were applied to the data file when it was stored in the capacity tier of the storage system.

In at least one of the various embodiments, an execution environment, such as, a virtual machine, a process, or the like, may be initialized for each filter in the processing pipeline and used for applying the filters the data files.

Illustrative Operating Environment

FIG. 1 shows components of one embodiment of an environment in which embodiments of the invention may be practiced. Not all of the components may be required to practice the invention, and variations in the arrangement and type of the components may be made without departing from the spirit or scope of the invention. As shown, system 100 of FIG. 1 includes local area networks (LANs)/wide area networks (WANs)—(network) 110, wireless network 108, client computers 102-105, Storage Management Server Computer 116, Storage Computer 118, Storage Computer 120, or the like.

At least one embodiment of client computers 102-105 is described in more detail below in conjunction with FIG. 2. In one embodiment, at least some of client computers 102-105 may operate over one or more wired and/or wireless networks, such as networks 108, and/or 110. Generally, client computers 102-105 may include virtually any computer capable of communicating over a network to send and receive information, perform various online activities, offline actions, or the like. In one embodiment, one or more of client computers 102-105 may be configured to operate within a business or other entity to perform a variety of services for the business or other entity. For example, client computers 102-105 may be configured to operate as a web server, firewall, client application, media player, mobile telephone, game console, desktop computer, or the like. However, client computers 102-105 are not constrained to these services and may also be employed, for example, as for end-user computing in other embodiments. It should be recognized that more or less client computers (as shown in FIG. 1) may be included within a system such as described herein, and embodiments are therefore not constrained by the number or type of client computers employed.

Computers that may operate as client computer 102 may include computers that typically connect using a wired or wireless communications medium such as personal computers, multiprocessor systems, microprocessor-based or programmable electronic devices, network PCs, or the like. In some embodiments, client computers 102-105 may include virtually any portable computer capable of connecting to another computer and receiving information such as, laptop computer 103, mobile computer 104, tablet computers 105, or the like. However, portable computers are not so limited and may also include other portable computers such as cellular telephones, display pagers, radio frequency (RF) devices, infrared (IR) devices, Personal Digital Assistants (PDAs), handheld computers, wearable computers, integrated devices combining one or more of the preceding computers, or the like. As such, client computers 107-105 typically range widely in terms of capabilities and features. Moreover, client computers 102-105 may access various computing applications, including a browser, or other web-based application.

A web-enabled client computer may include a browser application that is configured to receive and to send web pages, web-based messages, and the like. The browser application may be configured to receive and display graphics, text, multimedia, and the like, employing virtually any web-based language, including a wireless application protocol messages (WAP), and the like. In one embodiment, the browser application is enabled to employ Handheld Device Markup Language (HDML), Wireless Markup Language (WML), WMLScript, JavaScript, Standard Generalized Markup Language (SGML), Hypertext Markup Language (HTML), eXtensible Markup Language (XML), JavaScript Object Notation (JSON), or the like, to display and send a message. In one embodiment, a user of the client computer may employ the browser application to perform various activities over a network (online). However, another application may also be used to perform various online activities.

Client computers 102-105 also may include at least one other client application that is configured to receive and/or send content between another computer. The client application may include a capability to send and/or receive content, or the like. The client application may further provide information that identifies itself, including a type, capability, name, and the like. In one embodiment, client computers 102-105 may uniquely identify themselves through any of a variety of mechanisms, including an Internet Protocol (IP) address, a phone number, Mobile Identification Number (MIN), an electronic serial number (ESN), or other device identifier. Such information may be provided in a network packet, or the like, sent between other client computers, storage management server computer 116, storage computer 118, storage computer 120, or other computers.

Client computers 102-105 may further be configured to include a client application that enables an end-user to log into an end-user account that may be managed by another computer, such as storage management server computer 116, storage computer 118, storage computer 120, or the like. Such an end-user account, in one non-limiting example, may be configured to enable the end-user to manage one or more online activities, including in one non-limiting example, project management, software development, system administration, configuration management, search activities, social networking activities, browse various websites, communicate with other users, or the like.

Wireless network 108 is configured to couple client computers 103-105 and its components with network 110. Wireless network 108 may include any of a variety of wireless sub-networks that may further overlay stand-alone ad-hoc networks, and the like, to provide an infrastructure-oriented connection for client computers 103-105. Such sub-networks may include mesh networks, Wireless LAN (WLAN) networks, cellular networks, and the like. In one embodiment, the system may include more than one wireless network.

Wireless network 108 may further include an autonomous system of terminals, gateways, routers, and the like connected by wireless radio links, and the like. These connectors may be configured to move freely and randomly and organize themselves arbitrarily, such that the topology of wireless network 108 may change rapidly.

Wireless network 108 may further employ a plurality of access technologies including 2nd (2G), 3rd (3G), 4th (4G) 5th (5G) generation radio access for cellular systems, WLAN, Wireless Router (WR) mesh, and the like. Access technologies such as 2G, 3G, 4G, 5G, and future access networks may enable wide area coverage for mobile computers, such as client computers 103-105 with various degrees of mobility. In one non-limiting example, wireless network 108 may enable a radio connection through a radio network access such as Global System for Mobil communication (GSM), General Packet Radio Services (GPRS), Enhanced Data GSM Environment (EDGE), code division multiple access (CDMA), time division multiple access (TDMA), Wideband Code Division Multiple Access (WCDMA), High Speed Downlink Packet Access (HSDPA), Long Term Evolution (LTE), and the like. In essence, wireless network 108 may include virtually any wireless communication mechanism by which information may travel between client computers 103-105 and another computer, network, a cloud-based network, a cloud instance, or the like.

Network 110 is configured to couple network computers with other computers, including, storage management server computer 116, storage computer 118, storage computer 120, client computers 102 105 through wireless network 108, or the like. Network 110 is enabled to employ any form of computer readable media for communicating information from one electronic device to another. Also, network 110 can include the internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another. In addition, communication links within LANs typically include twisted wire pair or coaxial cable, while communication links between networks may utilize analog telephone lines, full or fractional dedicated digital lines including T1, T2, T3, and T4, and/or other carrier mechanisms including, for example, E-carriers, Integrated Services Digital Networks (ISDNs), Digital Subscriber Lines (DSLs), wireless links including satellite links, or other communications links known to those skilled in the art. Moreover, communication links may further employ any of a variety of digital signaling technologies, including without limit, for example, DS-0, DS-1, DS-2, DS-3, DS-4, OC-3, OC-12, OC-48, or the like. Furthermore, remote computers and other related electronic devices could be remotely connected to either LANs or WANs via a modem and temporary telephone link. In one embodiment, network 110 may be configured to transport information of an Internet Protocol (IP).

Additionally, communication media typically embodies computer readable instructions, data structures, program modules, or other transport mechanism and includes any information delivery media. By way of example, communication media includes wired media such as twisted pair, coaxial cable, fiber optics, wave guides, and other wired media and wireless media such as acoustic, RF, infrared, and other wireless media.

One embodiment of storage management server computer 116 is described in more detail below in conjunction with FIG. 3. Briefly, however, storage management server computer 116 includes virtually any network computer capable of managing data storage in network environment for one or more applications or services.

Although FIG. 1 illustrates storage management server computer 116, storage computer 118, storage computer 120 each as a single computer, the innovations and/or embodiments are not so limited. For example, one or more functions of storage management server computer 116, storage computer 118, storage computer 120, or the like, may be distributed across one or more distinct network computers. Moreover, storage management server computer 116, storage computer 118, storage computer 120 are not limited to a particular configuration such as the one shown in FIG. 1. Thus, in one embodiment, storage management server computer 116, storage computer 118, or storage computer 120 may be implemented using a plurality of network computers. In other embodiments, server computer may operate as a plurality of network computers within a cluster architecture, a peer-to-peer architecture, or the like. Further, in at least one of the various embodiments, storage management server computer 116, storage computer 118, or storage computer 120 may be implemented using one or more cloud instances in one or more cloud networks.

Also, in at least one of the various embodiments, one or more storage management server computers, or at least some or all of the features thereof, may be incorporated in a storage computer, such as, storage computer 118, or storage computer 120. Accordingly, these innovations and embodiments are not to be construed as being limited to a single environment, and other configurations, and architectures arc also envisaged.

Illustrative Client Computer

Figure 2:
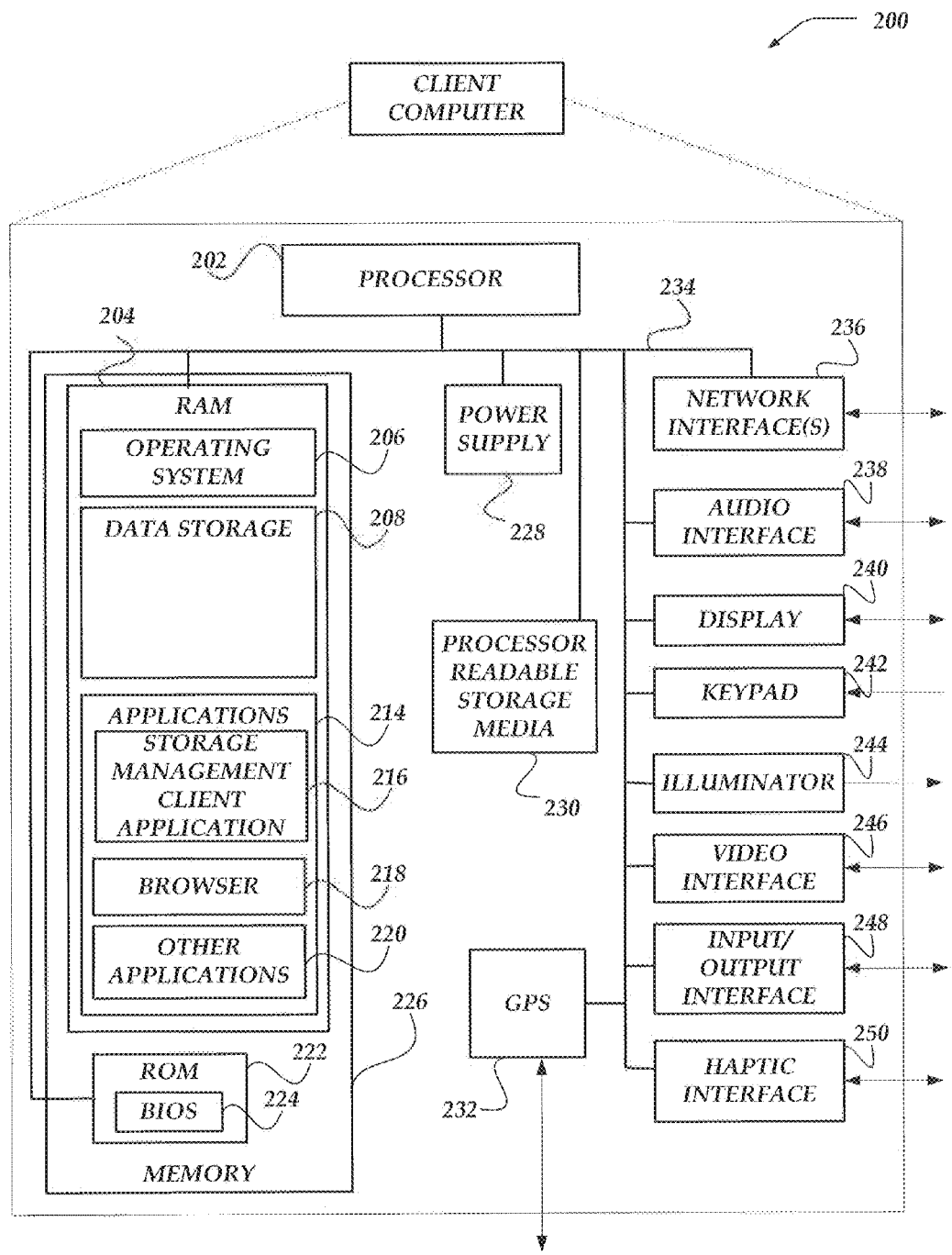
FIG. 2 shows a logical schematic embodiment of a client computer.

FIG. 2 shows one embodiment of client computer 200 that may be included in a system in accordance with at least one of the various embodiments. Client computer 200 may include many more or less components than those shown in FIG. 2. However, the components shown are sufficient to disclose an illustrative embodiment for practicing the present invention. Client computer 200 may represent tor example, one embodiment of at least one of client computers 102-105 of FIG. 1.

As shown in the figure, client computer 200 includes a processor 202 in communication with a mass memory 226 via a bus 234. In some embodiments, processor 202 may include one or more central processing units (CPU), Client computer 200 also includes a power supply 228, one or more network interfaces 236, an audio interface 238, a display 240, a keypad 242, an illuminator 244, a video interface 246, an input/output interface 248, a haptic interface 250, and a global positioning system (GPS) receiver 232.

Power supply 228 provides power to client computer 200. A rechargeable or non-rechargeable battery may be used to provide power. The power may also be provided by an external power source, such as an alternating current (AC) adapter or a powered docking cradle that supplements and/or recharges a battery.

Client computer 200 may optionally communicate with a base station (not shown), or directly with another computer. Network interface 236 includes circuitry for coupling client computer 200 to one or more networks, and is constructed for use with one or more communication protocols and technologies including, but not limited to, GSM, CDMA, TDMA, GPRS, EDGE, WGDMA, HSDPA, LTE, user datagram protocol (UDP), transmission control protocol/Internet protocol (TCP/IP), short message service (SMS), WAP, ultra wide band (UWB), IEEE 802.16 Worldwide Interoperability for Microwave Access (WiMax), session initiated protocol/real-time transport protocol (SIP/RTP), or any of a variety of other wireless communication protocols. Network interface 236 is sometimes known as a transceiver, transceiving device, or network interface card (NIC).

Audio interface 238 is arranged to provinance and receive audio signals such as the sound of a human voice. For example, audio interface 238 may be coupled to a speaker and microphone (not shown) to enable telecommunication with others and/or generate an audio acknowledgement for some action.

Display 240 may be a liquid crystal display (LCD), gas plasma, light emitting diode (LED), organic LED, or any other type of display used with a computer. Display 240 may also include a touch sensitive screen arranged to receive input from an object such its a stylus or a digit from a human hand.

Keypad 242 may comprise any input device arranged to receive input from a user. For example, keypad 242 may include a push button numeric dial, or a keyboard. Keypad 242 may also include command buttons that are associated with selecting and sending images.

Illuminator 244 may provide n status indication and/or provide light. Illuminator 244 may remain active for specific periods of time or in response to events. For example, when illuminator 244 is active, it may backlight the buttons on keypad 242 and stay on while the client computer is powered. Also, illuminator 244 may backlight these buttons in various patterns when particular actions are performed, such as dialing another client computer. Illuminator 244 may also cause light sources positioned within a transparent or translucent case of the client computer to illuminate in respond to actions.

Video interface 246 is arranged to capture video images, such as a still photo, a video segment, an infrared video, or the like. For example, video interface 246 may be coupled to a digital video camera, a web-camera, or the like. Video interlace 246 may comprise a lens, an image sensor, and other electronics. Image sensors may include a complementary metal-oxide-semiconductor (CMOS) integrated circuit, charge-coupled device (CCD), or any oilier integrated circuit for sensing light.

Client computer 200 also comprises input/output interface 248 for communicating with external devices, such as a headset, or other input or output devices not shown in FIG. 2. Input/output interface 248 can utilize one or more communication technologies, such as USB, infrared, Bluetooth™, or the like.

Haptic interface 250 is arranged to provide tactile feedback to a user of the client computer. For example, the haptic interface 250 may be employed to vibrate client computer 200 in a particular way when another user of a computer is calling. In some embodiments, haptic interlace 250 may be optional.

Client computer 200 may also include GPS transceiver 232 to determine the physical coordinates of client computer 200 on the surface of the Earth. GPS transceiver 232, in some embodiments, may be optional. GPS transceiver 232 typically outputs a location as latitude and longitude values. However, GPS transceiver 232 can also employ other geo-positioning mechanisms, including, but not limited to, triangulation, assisted GPS (AGPS), Enhanced Observed Time Difference (E-OTD), Cell Identifier (CI), Service Area Identifier (SAI), Enhanced Timing Advance (ETA), Base Station Subsystem (BSS), or the like, to further determine the physical location of client computer 200 on the surface of the Earth. It is understood that under different conditions, GPS transceiver 232 can determine a physical location within millimeters for client computer 200; and in other cases, the determined physical location may be less precise, such as within a meter or significantly greater distances. In one embodiment, however, client computer 200 may through other components, provide other information that may he employed to determine a physical location of the computer, including for example, a Media Access Control (MAC) address, IP address, or the like.

Mass memory 226 includes a Random Access Memory (RAM) 204, a Read-only Memory (ROM) 222, and other storage means. Mass memory 226 illustrates an example of computer readable storage media (devices) for storage of information such as computer readable instructions, data structures, program modules or other data. Mass memory 226 stores a basic input/output system (BIOS) 224, or the like, for controlling low-level operation of client computer 200. The mass memory also stores an operating system 206 for controlling the operation of client computer 200. It will be appreciated that this component may include a general-purpose operating system such as a version of UNIX, or LINUX™, or a specialized client communication operating system such as Microsoft Corporation's Windows Mobile™, Apple Corporation's iOS™, Google Corporation's Android™, or the like. The operating system may include, or interface with a Java virtual machine module that enables control of hardware components and/or operating system operations via Java application programs.

Mass memory 226 further includes one or more data storage 208, which can be utilized by client computer 200 to store, among other things, applications 214 and/or other data. For example, data storage 208 may also be employed to store information that describes various capabilities of client computer 200. The information may then be provided to another computer based on any of a variety of events, including being sent as part of a header during a communication, sent upon request, or the like. Data storage 208 may also be employed to store social networking information including address books, buddy lists, aliases, user profile information, user credentials, or the like. Further, data storage 208 may also store messages, web page content, or any of a variety of user generated content.

At least a portion of the information stored in data storage 208 may also be stored on another component of client computer 200, including, but not limited to processor readable storage media 230, a disk drive or other computer readable storage devices (not shown) within client computer 200.

Processor readable storage media 230 may include volatile, non-transitive, non-transitory, nonvolatile, removable, and non-removable media implemented in any method or technology for storage of information, such as computer- or processor-readable instructions, data structures, program modules, or other data. Examples of computer readable storage media include RAM, ROM, Electrically Erasable Programmable Read-only Memory (EEPROM), flash memory or other memory technology. Compact Disc Read-only Memory (CD-ROM), digital versatile disks (DVD) or other optical storage, magnetic cassettes, magnetic tape, magnetic disk storage or other magnetic storage devices, or any other physical medium which can be used to store the desired information and which can be accessed by a computer. Processor readable storage media 230 may also be referred to herein as computer readable storage media and/or computer readable storage device.

Applications 214 may include computer executable instructions which, when executed by client computer 200, transmit, receive, and/or otherwise process network data. Network data may include, but is not limited to, messages (e.g. SMS, Multimedia Message Service (MMS), instant message (IM), email, and/or other messages), audio, video, and enable telecommunication with another user of another client computer. Applications 214 may include, for example, a browser 218, and other applications 220. Further, applications 214 may include storage management client application 216 for integrating one or more file systems with a storage system and/or integrating with a storage management application, or the like.

Browser 218 may include virtually any application configured to receive and display graphics, text, multimedia, messages, and the like, employing virtually any web based language. In one embodiment, the browser application is enabled to employ HDML, WML, WMLScript, JavaScript, SGML, HTML, XML, and the like, to display and send a message. However, any of a variety of other web-based programming languages may be employed. In one embodiment, browser 218 may enable a user of client computer 200 to communicate with another network computer, such as storage management server computer 116, storage computer 118, and/or storage computer 120 as shown in FIG. 1.

Other applications 220 may include, but are not limited to, calendars, search programs, email clients, IM applications, SMS applications, voice over Internet Protocol (VOIP) applications, contact managers, task managers, transcoders, database programs, word processing programs, software development tools, security applications, spreadsheet programs, games, search programs, and so forth.

Illustrative Network Computer

Figure 3:
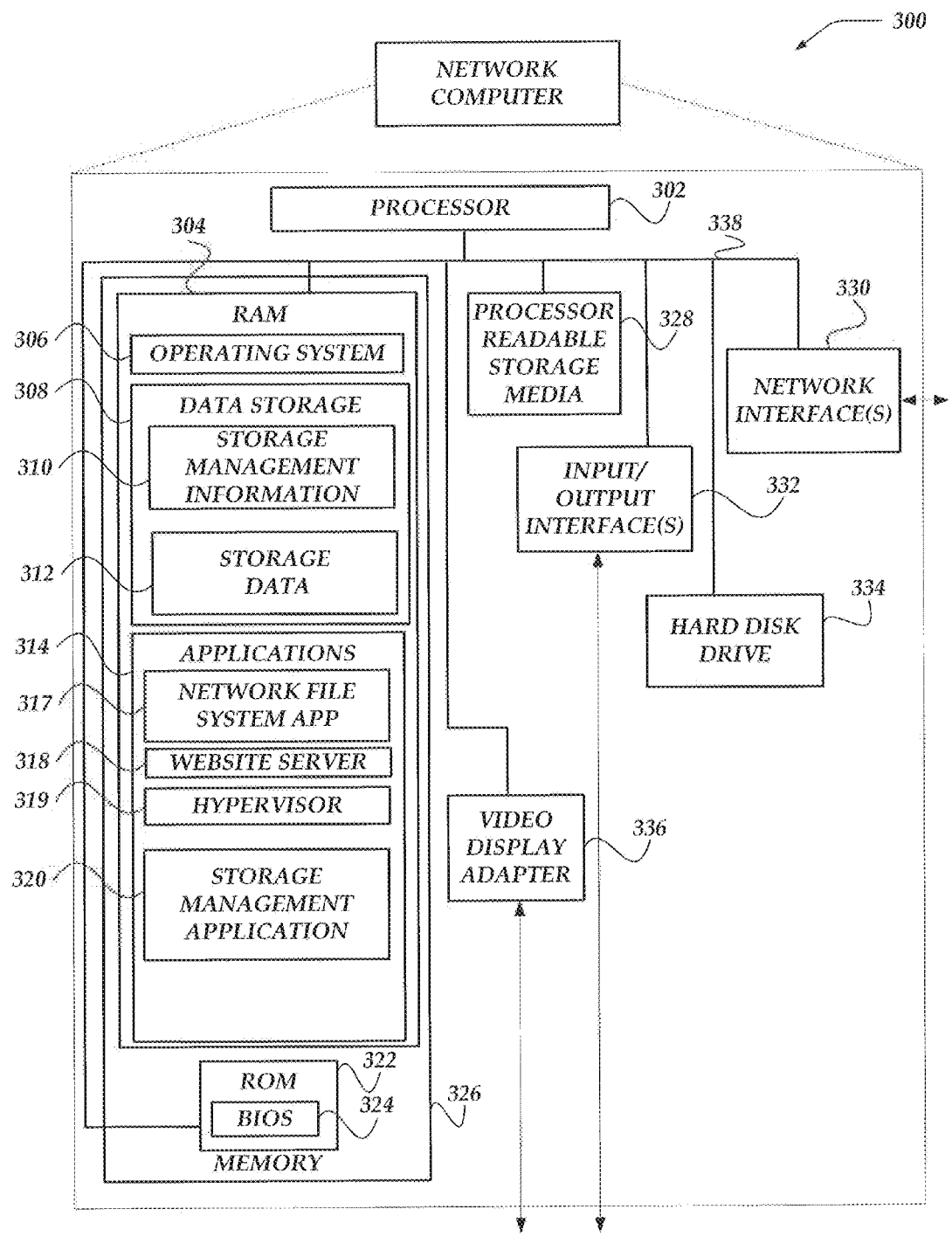
FIG. 3 illustrates a logical schematic embodiment of a network computer.

FIG. 3 shows one embodiment of a network computer 300, according to one embodiment of the invention. Network computer 300 may include many more or less components than those shown. The components shown, however, are sufficient to disclose an illustrative embodiment for practicing the invention. Network computer 300 may be configured to operate as a server, client, peer, a host, cloud instance, or any other computer. Network computer 300 may represent, for example storage management server computer 116, and/or other network computers, such as, computers comprising, storage computer 118, or storage computer 122.

Network computer 300 includes processor 302, processor readable storage media 328, network interface unit 330, an input/output interface 332, hard disk drive 334, video display adapter 336, and memory 326, all in communication with each other via bus 338. In some embodiments, processor 302 may include one or more central processing units.

As illustrated in FIG. 3, network computer 300 also can communicate with the Internet, or other communication networks, via network interface unit 330, which is constructed for use with various communication protocols including the TCP/IP protocol. Network interface unit 330 is sometimes known as a transceiver, transceiving device, or network interface card (NIC).

Network computer 300 also comprises input/output interlace 332 for communicating with external devices, such as a keyboard, or other input or output devices not shown in FIG. 3. Input/output interface 332 can utilize one or more communication technologies, such as USB, infrared, NFC, Bluetooth™, or the like.

Memory 326 generally includes RAM 304, ROM 322 and one or more permanent mass storage devices, such as hard disk drive 334, tape drive, optical drive, and/or floppy disk drive. Memory 326 stores operating system 306 for controlling the operation of network computer 300. Any general-purpose operating system may be employed. Basic input/output system (BIOS) 324 is also provided for controlling the low-level operation of network computer 300.

Although illustrated separately, memory 326 may include processor readable storage media 328. Processor readable storage media 328 may be referred to and/or include computer readable media, computer readable storage media, and/or processor readable storage device. Processor readable storage media 328 may include volatile, nonvolatile, non-transitory, non-transitive, removable, and non-removable media implemented in any method or technology for storage of information, such us computer readable instructions, data structures, program modules, or other data. Examples of processor readable storage media include RAM, ROM, EEPROM, flash memory or other memory- technology, CD-ROM, digital versatile disks (DVD) or other optical storage, magnetic cassettes, magnetic tape, magnetic disk storage or other magnetic storage devices, or any other media which can be used to store the desired information and which can be accessed by a computer.

Memory 326 further includes one or more data storage 308, which can be utilized by network computer 300 to store, among other things, applications 314 and/or other data. For example, data storage 308 may also be employed to store information that describes various capabilities of network computer 300. The information may then be provided to another computer based on any of a variety of events, including being sent as part of a header during a communication, sent upon request, or the like. Data storage 308 may also be employed to store messages, web page content, or the like. At least a portion of the information may also be stored on another component of network computer 300, including, but not limited to processor readable storage media 328, hard disk drive 334, or other computer readable storage medias (not shown) within network computer 300.

Data storage 308 may include a database, text, spreadsheet, folder, file, or the like, that may he configured to maintain and store user account identifiers, user profiles, email addresses, IM addresses, and/or other network addresses; or the like. Data storage 308 may further include program code, data, algorithms, and the like, for use by a processor, such as processor 302 to execute and perform actions. In one embodiment, at least some of data store 308 might also be stored on another component of network computer 300, including, but not limited to processor-readable storage media 328, hard disk drive 334, or the like.

Further, in at least one of the various embodiments, a network computer arranged as a storage computer, such as, storage computer 118 or storage computer 120, may include one or more hard drives, optical drives, solid stale storage drives or the like, for storing the data stored by a storage system.

Data storage 308 may include storage management information 310. In at least one of the various embodiments, storage management information 310 may include information, such as, storage computer/device status, repair task lists, resource budget information, capacity information, user profiles, or the like. Also, in at least one of the various embodiments, data storage 308 may include storage data 312 representing data and information that may be stored on a storage device and/or a storage computer.

Applications 314 may include computer executable instructions, which may be loaded into mass memory and run on operating system 306. Examples of application programs may include transcoders, schedulers, calendars, database programs, word processing programs. Hypertext Transfer Protocol (HTTP) programs, customizable user interface programs, IPSec applications, encryption programs, security programs, SMS message servers, IM message servers, email servers, account managers, and so forth. Applications 314 may also include, network file system application 317, website server 318, hypervisor 319, storage management application 320, or the like.

Website server 318 may represent any of a variety of information and services that are configured to provide content, including messages, over a network to another computer. Thus, website server 318 can include, for example, a web server, a File Transfer Protocol (FTP) server, a database server, a content server, email server, or the like. Website server 318 may provide the content including messages over the network using any of a variety of formats including, but not limited to WAP, HDML, WML, SGML, HTML, XML, Compact HTML (cHTML), Extensible HTML (xHTML), or the like.

Illustrative Logical Architecture

In at least one of the various embodiments, extensible data paths may be operative in a data storage system. In at least one of the various embodiments, storage computers, storage devices, or the like, may be organized into different arrangements not limited to those described below depending on the specific storage requirements of the applications and/or services that may be using the storage systems.

Figure 4:
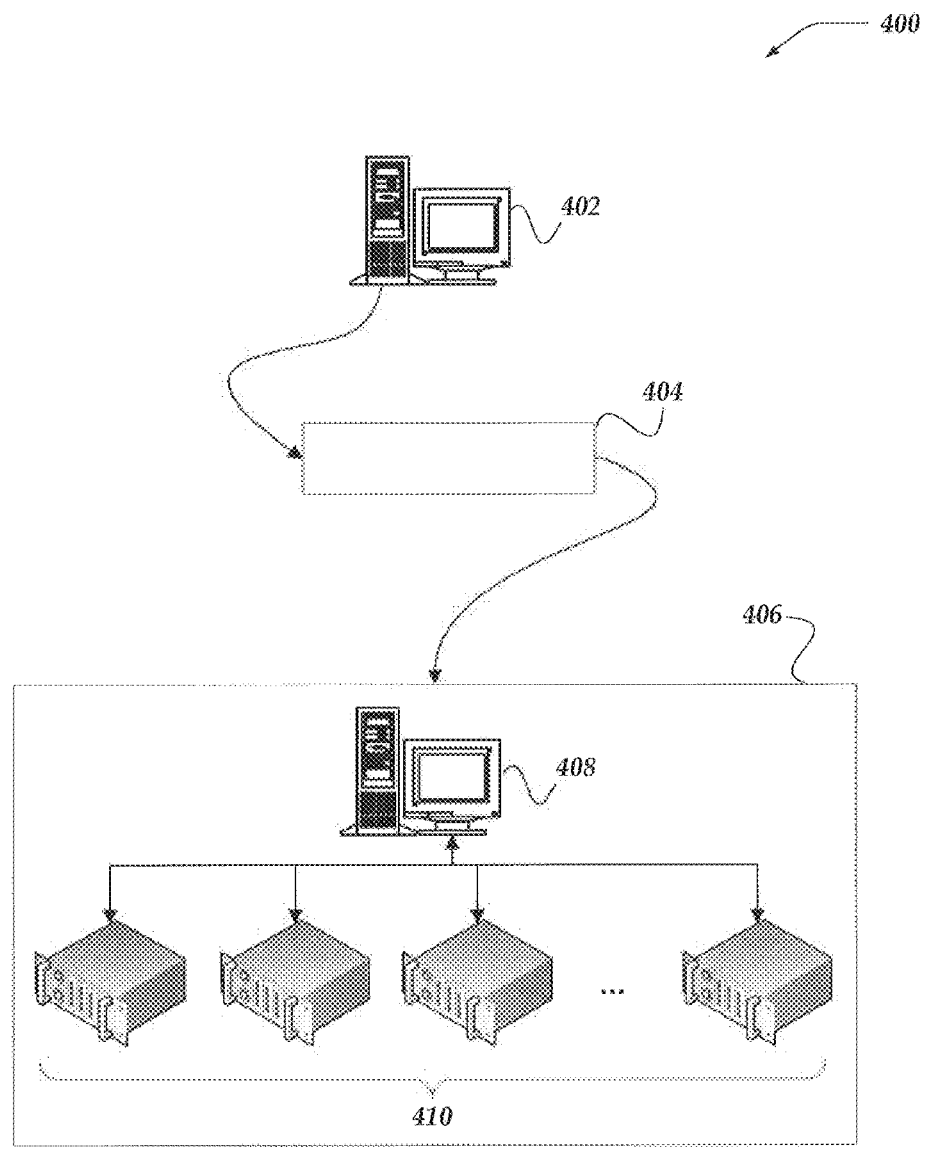
FIG. 4 shows a logical schematic of a portion of a data storage system for arranged to support extensible data paths in accordance with at least one of the various embodiments.

FIG. 4 shows a logical schematic of a portion of data storage system 400 for arranged to support extensible data paths in accordance with at least one of the various embodiments. In at least one of the various embodiments, a network computer or client computer, such as, computer 402 may be operative to provide data blocks for storage. In at least one of the various embodiments, the data from computer 402 may be provided to cache tier 404. Cache tier 404 may be arranged to provide low-latency stable storage. Client computers, such as, computer 402 may obtain rapid responses from cache tier 404 acknowledging that the data has been written to stable storage in the storage system.

In at least one of the various embodiments, as data stored at cache tier 404 ages, it may he moved to capacity tier 406. Capacity tier 406 may be arranged to provide storage and storage services that can scale to support large data sets, provide data protection (e.g., erasure encoding, and protection levels), distributed storage, or the like. In at least one of the various embodiments, capacity tier 406 may include one or more storage management server computers, such as, storage management server computer 408. Also, in at least one of the various embodiments, capacity tier 406 may include one or more storage computers, such as, storage computers 410. In some embodiments, one or more of the storage computers may be configured to operate as a storage management server and be arranged to include storage management application 320.

Figure 5:
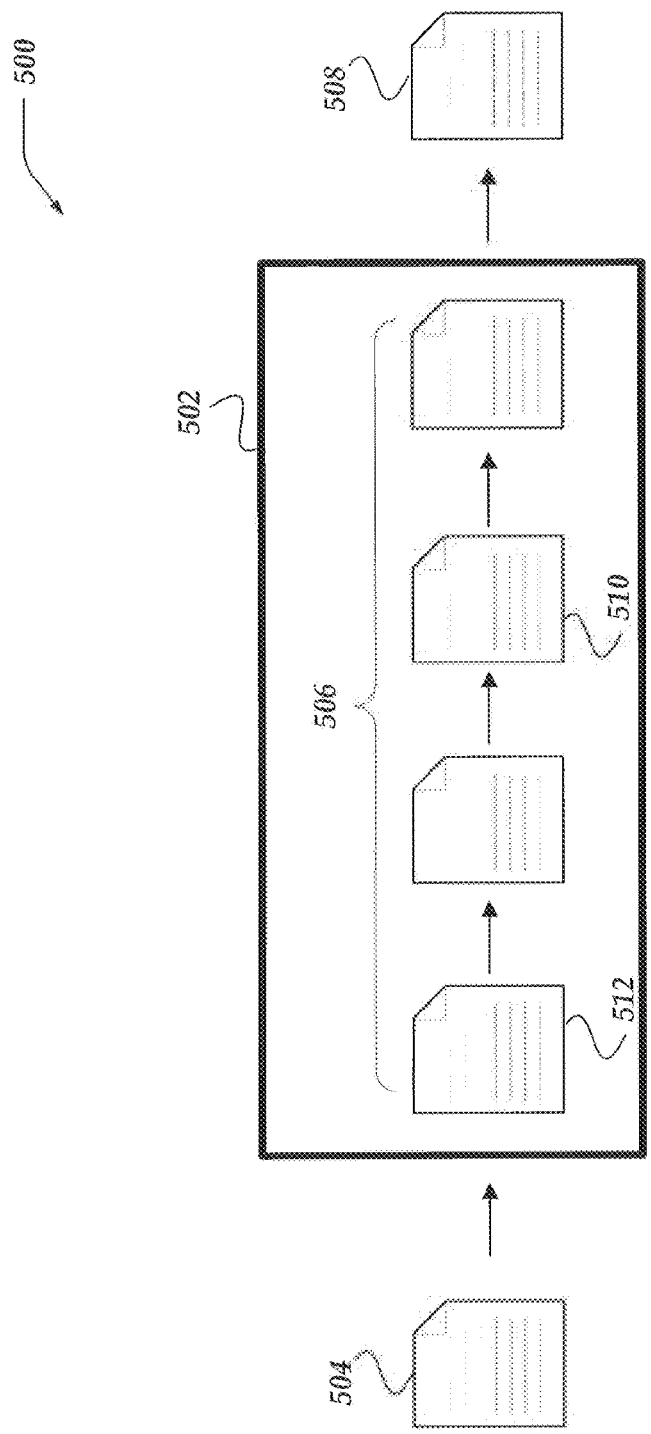
FIG. 5 illustrates a logical schematic for a portion of a caching tier in accordance with at least one of the various embodiments.

FIG. 5 illustrates a logical schematic for a portion of cache tier 500 in accordance with at least one of the various embodiments. In at least one of the various embodiments, cache tier 500 includes aging queue 502 for monitoring the how long a data file has been in the cache store and/or how much time has elapsed since the data file was last accessed and, accordingly, whether it should be moved to the capacity tier. Data file 504 represents data that is just arriving at the cache tier. Data files 506 represents a plurality of data tiles that have been stored in cache tier 500.

In at least one of the various embodiments, aging queue 502 may be arranged to track length, of time each data file has been on the cache tier. If the time a data tiles remains on the cache tier exceeds a configured threshold, a storage management application may move those data files to a capacity tier.

Also, in at least one of the various embodiments, aging queue 502 may be arranged to track the elapsed time since each data file has been accessed. In at least one of the various embodiments, if the elapsed time exceeds a configured threshold, a storage management application may be arranged to move those data tiles to a capacity tier. In at least one of the various embodiments, a combination of one or more of the above techniques may be employed for determining whether to move the data files from the caching tier.

Data file 508 represents a data file that is being moved out the cache tier and over to the capacity tier of a storage system.

In at least one of the various embodiments, if the contents of a data file is updated while the data is located on the cache tier, its age may be reset as if it is a new file. For example, in at least one of the various embodiments, if data file 510 is updated it may be moved to the position held by data file 512.

In at least one of die various embodiments, if the content of a data file is updated after it has left cache tier 502, it may be added to the cache tier as a new version. For example, since data file 508 has left the cache tier, if the same data file is updated again a new entry may be added to the age queue representing the new version of the data file rather than retrieve data file 508 for updating it.

In at least one of the various embodiments, caching queue may be arranged as collection of records, where each record includes information for finding/identifying the data file as well as the time it was provided to the caching tier. Thus, the caching tier may layout the physical storage of the data file independently from the ordering represented by the ageing queue. In at least one of the various embodiments, the ageing queue may be maintained in a sorted order based on the arrival times of data files to the caching tier but the underlying storage of the data file in the caching may be sorted/arranged differently as needed.

Figure 6:
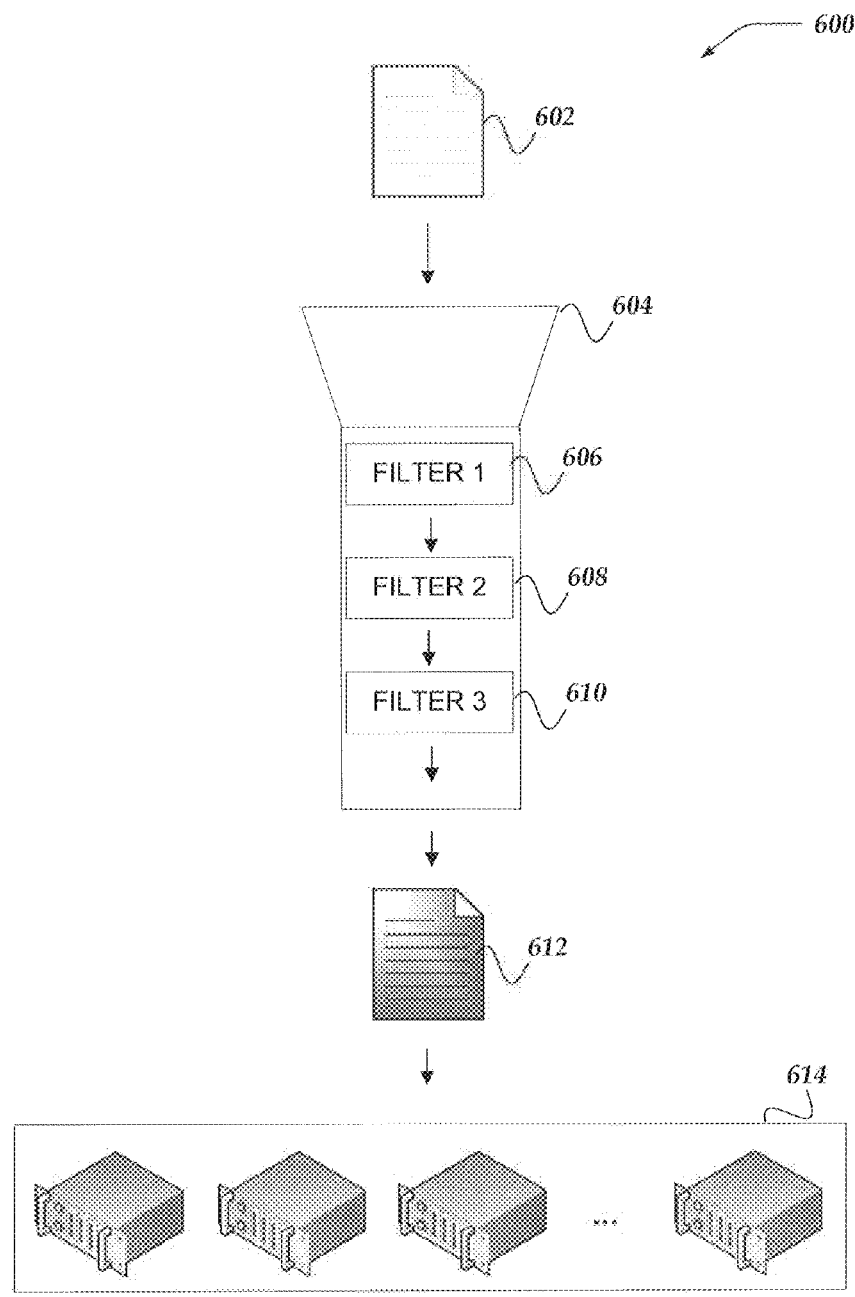
FIG. 6 illustrates a logical schematic of a portion of a capacity tier in accordance with at least one of the various embodiments.

FIG. 6 illustrates a logical schematic of a portion of capacity tier 600 in accordance with at least one of the various embodiments. In at least one of the various embodiments, if a data file, such as, data file 602 is provided to a capacity tier of a storage system, it may be passed to a processing pipeline, such as, processing pipeline 604. Processing pipeline 604 may be part of a storage management application, such as, storage management application 320. Accordingly, in at least one of the various embodiments, one or more filters such as, filter 606, filter 608, filter 610, or the like, in processing pipeline 604 may be applied to data file 602. If the filters have been applied to the data file it may be provided for storage at storage tier 614. In at least one of the various embodiments, storage tier 614 may be comprised one or more storage computers and/or storage devices. In at least one of the various embodiments, after each relevant filter has been applied data file 602 it may be transformed into data file 612 and provided to storage tier 614 tor storage.

In at least one of the various embodiments, a filter may be a hardware or software process that is enabled to access the contents and/or meta-data of the data file. Some filters may be arranged to transform the content of the data file. In at least one of the various embodiments, such transforms may include, but are not limited to, compression, decompression, encryption, decryption, audio processing, image scaling, video transcoding, translations, duplicating, optical, character recognition, or the like.

Further, in at least one of the various embodiments, filters may be arranged to generate additional information based on the data file, such as, creating one or more indexes based on content or characteristics of she data file, adding meta data (e.g., tags), computing metrics/statistics, or the like.

In at least one of the various embodiments, the particular filter that may be applied to a data file may vary depending on the configuration of the storage system. Also, in at least one of the various embodiments, some filters may be built-in filters provided by the storage system and some may be custom filters provided by a third party. Further, some filters may be mandatory and others may be optional.

In at least one of the various embodiments, to support filters, a storage management application may be arranged to provide a uniform API that filters may employ to access the data files and related information for performing their operations.

In at least one of the various embodiments, as a data file progresses through processing pipeline 604, the storage management application may be arranged to maintain and update additional data and/or meta-data into one or more data structures corresponding to each data file. Further, a record of each filter applied to the data file may be recorded as well. See, FIG. 7 and its accompanying description below.

In at least one of the various embodiments, a storage management application may be arranged to enable a user to register one or more filters to be applied to data files that are stored in the storage system.

Furthermore, in at least one of the various embodiments, some or all of processing pipeline 604 may be arranged to be part of a caching tier, one or more independent server computers, or the capacity tier, or combination thereof.

Figure 7:
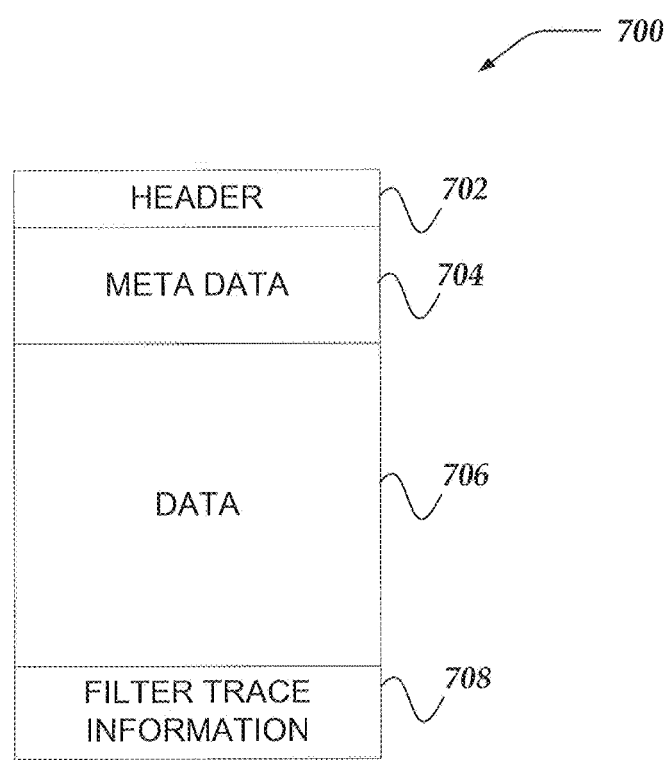
FIG. 7 illustrates a logical representation of a data structure for representing a data file in accordance with at least one of the various embodiments.

FIG. 7 illustrates a logical representation of date structure 700 tor representing a data file in accordance with at least one of the various embodiments. In at least one of the various embodiments, as data files are provided to the storage system, a storage management application may generate one or more data structures for managing and/or handling the date file while it is the storage system. In some cases, the additional information for managing the data file may be appended and/or prepended to the provided data file. In other embodiments, the additional information may be linked to the actual data file by reference. For example, the data structure may include a field for including a unique identifier that identifies the data file that corresponds to a data structure that includes the additional information.

In at least one of the various embodiments, data structure 700 may include header 702 for storing information for identifying the data file, its location, size, or the like. Also, in at least one of the various embodiments, data structure 700 may include metadata section 704 for including one or more named value pairs that may be associated with the data file. In at least one of the various embodiments, if the data structure includes the data file data (rather than referencing it indirectly), data section 706 may include the current contents of the data file.

In at least one of the various embodiments, filter trace section 708 may include records indicating which filters have been applied the data file and the order they were applied. Accordingly, in at least one of the various embodiments, the filters that are used when storing the data file to the capacity tier may be replayed when retrieving the data file from the capacity tier.

In at least one of the various embodiments, a data structure, such as, data structure 700, may be provided to each filter in a processing pipeline enabling the filter to access relevant information regarding the data file that is being processed. In at least one of the various embodiments, different filter may have different levels of access to information in the data structure. In some embodiments, some fields, and/or information included in the data structure may be hidden or otherwise restricted from one or more filters. In at least one of the various embodiments, some filters may be enabled to add private information the data structure that may only be accessed by certain filters. For example, some filters in a processing pipeline may be arranged to perform administrative functions on behalf of, or as part of, a storage management application, such as, storage management application 320. Accordingly, in at least one of the various embodiments, some information in data structure 700 that may be associated with administrative functions may be hidden from one or more other filters.

In at least one of the various embodiments, once a data file is provided to the storage system, a storage management application may generate a data structure, such as, data structure 700 for maintaining information need to process and/or manage the data file. Accordingly, the information in the data structure may be available with the data file. Also, in at least one of the various embodiments, the representation of the data file in the storage system may include a data structure, such as, data structure 700.

One of ordinary skill in the art will appreciate, in at least one of the various embodiments, data structure 700 may be implemented using one or more well-known data structures techniques that may be compatible with one or more computer languages, operating systems, databases, or the like. Further, in some embodiments, data structure 700 may include more or less information than shown herein without departing from scope of the innovations herein. Accordingly, one of ordinary skill in the art, will appreciate that the description of data structure 700 is at least sufficient for practicing the innovations included herein.

Generalized Operation

FIGS. 8-13 represent the generalized operation for extensible data paths in accordance with at least one of the various embodiments. In at least one of the various embodiments, processes 800, 900, 1000, 1100, 1200 and 1300 described in conjunction with FIGS. 8-13 may be implemented by and/or executed on a single network computer, such as network computer 300 of FIG. 3. In other embodiments, these processes, or portions thereof, may be implemented by and/or executed on a plurality of network computers, such as network computer 300 of FIG. 3. In yet other embodiments, these processes, or portions thereof, may be implemented by and/or executed on one or more virtualized computer, such as, those in a cloud-based environment. However, embodiments are not so limited and various combinations of network computers, client computers, or the like may be utilized. Further, in at least one of the various embodiments, the processes described in conjunction with FIGS. 8-13 may be operative in storage systems and/or architectures such as those described in conjunction with FIGS. 4-7.

Figure 8:
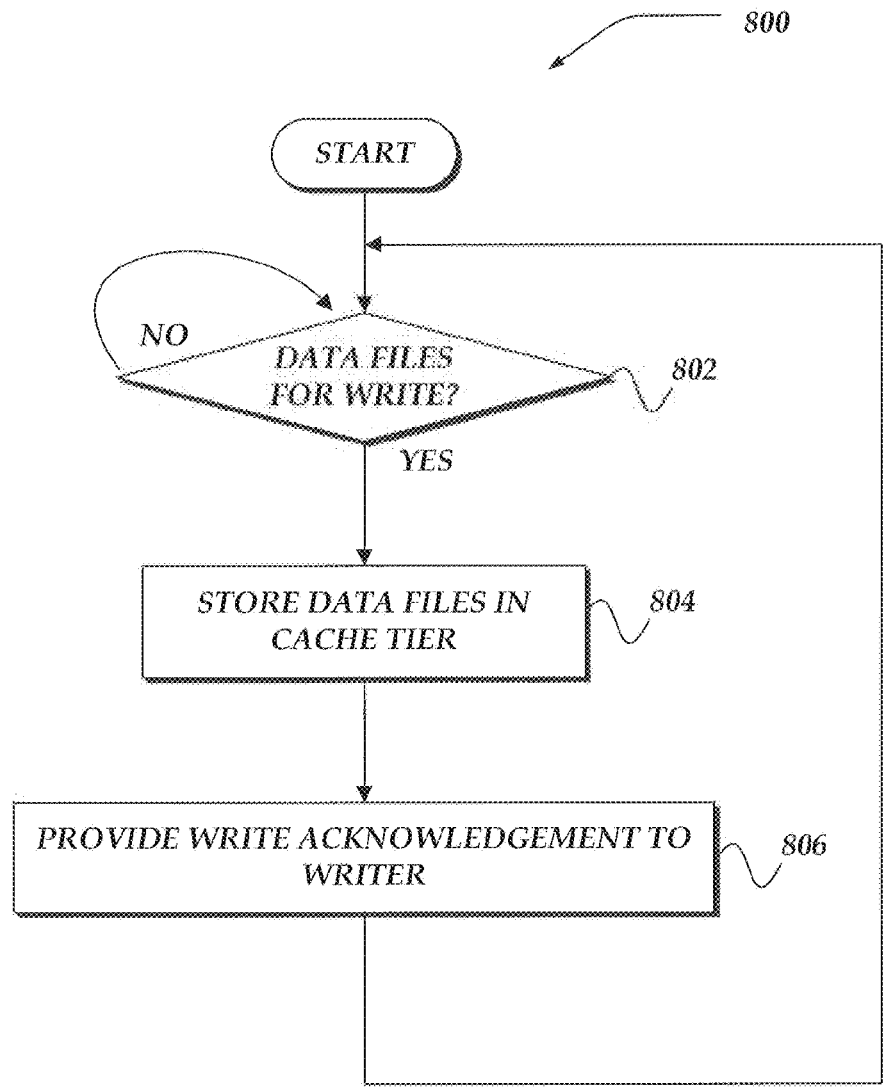
FIG. 8 shows an overview flowchart for a process for extensible data paths in a storage system in accordance with at least one of the various embodiments.

FIG. 8 shows an overview flowchart for process 800 for extensible data paths in a storage system in accordance with at least one of the various embodiments. In particular, for at least one embodiment, process 800 may be arranged to interface with one or more clients of the storage system. After a start block, at decision block 802, in at least one of the various embodiments, if the one or data files may be available for writing to a storage system, control may flow to block 804; otherwise, control may remain at decision block 802.

In at least one of the various embodiments, data files may be provided by one or more clients or client applications that may be operating on one or more computers, such as, network computer 300, or client computers, such as, client computer 200, that may be interconnected to the storage system over a network, such as, network 110 or network 108, or the like.

In at least one of the various embodiments, the data file may be provided using one or more standard or non-standard file system interfaces (e.g., NFS, POSIX, or the like) or over one or more remote interfaces, such as, RFC, XMLRPC, HTTP, FTP, or the like.

At block 804, in at least one of the various embodiments, the provided data files may be stored in a cache tier of a storage system. In at least one of the various embodiments, data files provided to the storage system may first be written to a caching tier. The caching tier may be arranged to respond quickly to write requests from the clients of the storage system.

In at least one of the various embodiments, the data file may be provided to the caching tier over a network using one or more well-known network communication protocols, such as, TCP/IP, UDP, or the like.

At block 806, in at least one of the various embodiments, an acknowledgement that the write operation has been received and executed at the caching tier may be communicated to the writers of the data files. In at least one of the various embodiments, the write acknowledgement informs the writer that the data files have reached stable storage.

In at least one of the various embodiments, additional information used for tracking/location the data file in the storage system, may be generated and added or associated with the data tile. See, FIG. 7 and its accompanying description.

In at least one of the various embodiments, the time the data file is received by the caching tier may be updated and/or an aging timer may be started tor the data files. The length of time since the data file has remained unmodified may be tracked for determining if the data file should be removed from the cache tier and provided to a capacity tier. Also, in at least one of the various embodiments, time elapsed since the data file was last accessed may be tracked for determining if the data file is eligible tor removing from the cache tier and providing to the capacity tier. For example, a data file opened for a read operation may be considered to 'accessed' even though its contents will not be modified by the read operation. Likewise, data files opened for writes (e.g., for updating) may also be considered to be accessed.

In at least one of the various embodiments, the caching tier may be optimized for receiving data files and quickly storing them to storage devices. Accordingly, in at least one of the various embodiments, additional processing, such as, erasure coding, may be performed at a later time as the data tiles are saved to a capacity tier. Next, in at least one of the various embodiments, control may loop back to decision block 802 to wait for more data files to be provided for writing.

Figure 9:
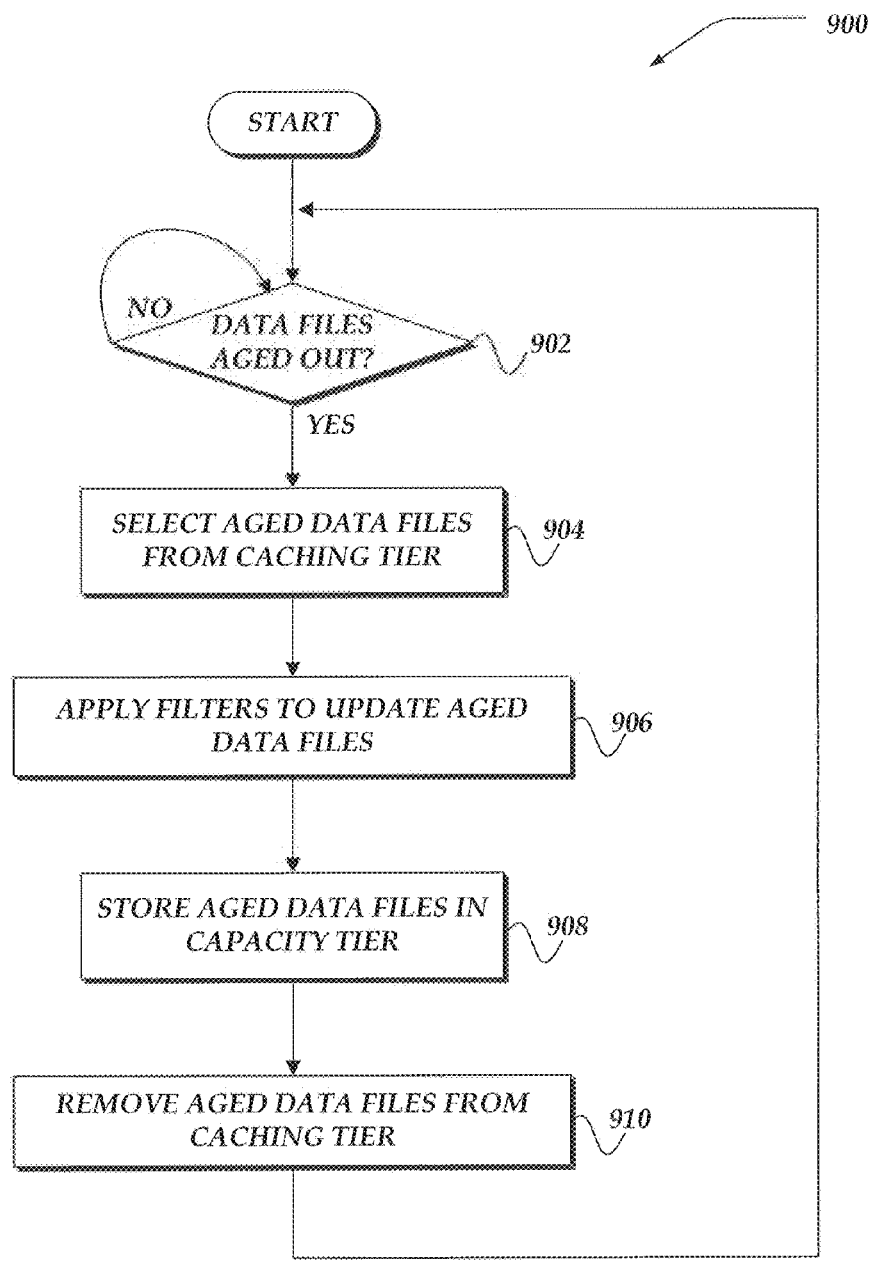
FIG. 9 shows an overview flowchart for a process for extensible data paths in a storage system in accordance with at least one of the various embodiments.

FIG. 9 shows an overview flowchart for process 900 for extensible data paths in a storage system in accordance with at least one of the various embodiments. After a start block, as decision block 902, if one or more data files have aged out of the caching tier, control may flow to block 904; otherwise, control may remain at decision block 902.

In at least one of the various embodiments, the length of time a data file remains unchanged in the caching is tracked. Also, in at least one of the various embodiments, aging may be computed on the time elapsed since a data file is accessed (e.g., read or written to). In at least one of the various embodiments, as a data file remains un-accessed in the cache store of a caching tier it may be considered to be aging. In at least one of the various embodiments, as a data file remains in the cache store of a caching tier it may be considered to be aging. If the age of one or more data files exceeds a defined threshold, those data files may be considered to have aged out of the cache tier. In at least one of the various embodiments, the threshold value for determining if a data file has aged out may be stored as configuration information. In at least one of the various embodiments, the threshold may have different values for different type of data files and/or different sizes of data files.

At block 904, in at least one of the various embodiments, one or more data files that may have aged out may be selected for removal from the cache tier. In at least one of the various embodiments, a storage management application may be arranged to monitor the age of the data files in the cache of the caching tier. In some embodiments, the storage management application may periodically scan the data files to identity data files that have aged out. In other embodiments, the data files may he arranged as a first in first out queue (FIFO) such that the oldest data files are at the end of the of the queue. Also, in at least one of the various embodiments, rather than arranging the data file in queue, a log may be kept of when data files are added to the caching tier where each log record has at the time the data file is added and its identifier/location. Accordingly, the storage management application may be arranged to traverse the log file to discover data files that may have aged out of the caching tier.

At block 906, in at least one of the various embodiments, one or more filters may be applied to the aged data files. In at least one of the various embodiments, one or more data files that may be on their way to being stored in a capacity tier may first be provided to processing pipeline, such as, processing pipeline 604 (See, FIG. 6). Accordingly, one or move, filters may be applied to the data files before they reach the capacity tier for storage.

In at least one of the various embodiments, updating the data files may be based on applying each determined filter to data files in the processing pipeline, such that, each update that corresponds to each filter is cumulatively applied to the at least one data file except for at least each filter that exceeds a resource limit during its application to the at least one data file.

At block 908, in at least one of the various embodiments, the aged data files may be stored in the capacity tier of the storage system. After the relevant filters in the processing have been applied to the data files, they may be stored into stable/permanent storage in the capacity tier. In at least one of the various embodiments, some data files may be discarded rather than being stored, depending on the filters that may be applied. In some cases, in at least one of the various embodiments, data files may be stored without having any filter applied to them. In at least one of the various embodiments, the determination of which filters, if any, to apply to a data file may be based on configuration information that may comprise, configuration files, policy rules, pattern matching, user input, or the like, or combination thereof.

At block 910, in at least one of the various embodiments, Next, in at least one of the various embodiments, control may loop back to decision block 902.

Figure 10:
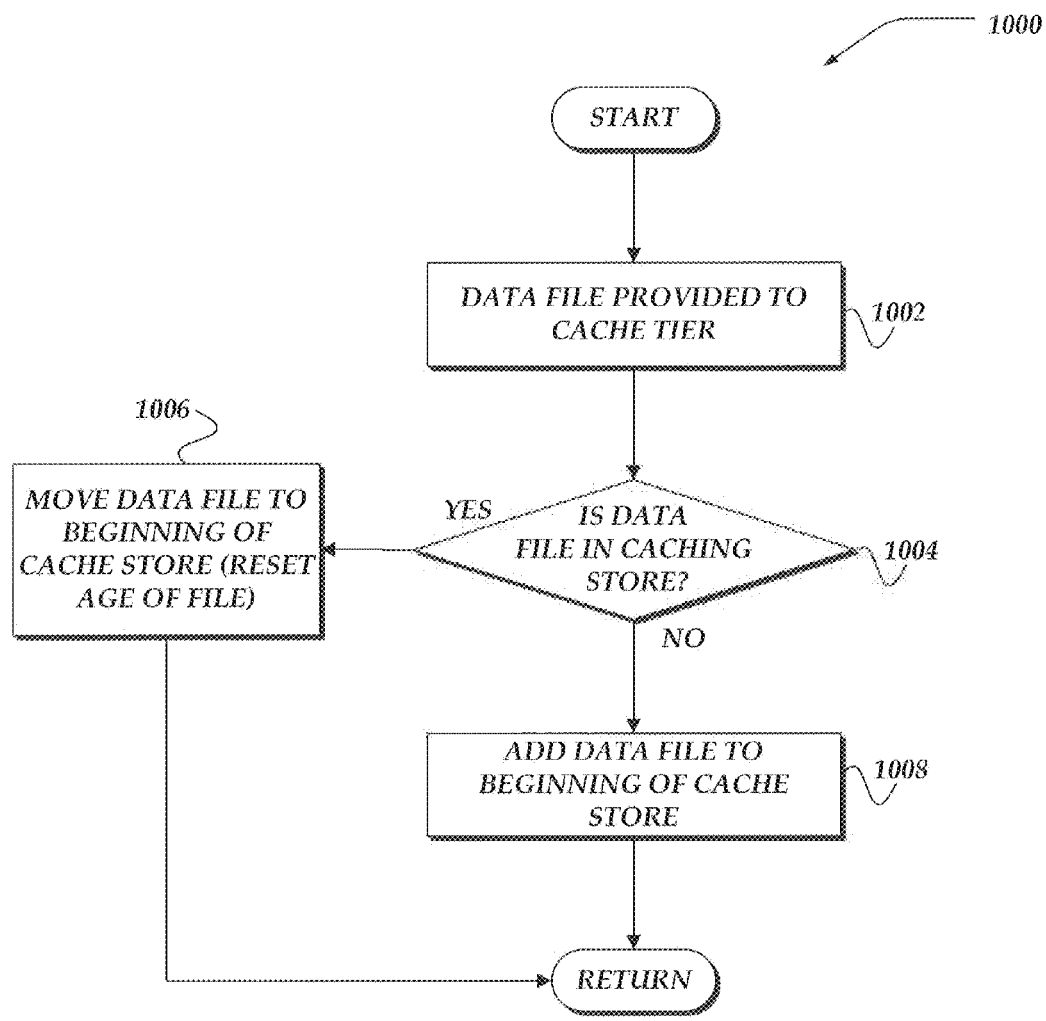
FIG. 10 shows an overview flowchart for a process for a caching tier in a storage system in accordance with at least one of the various embodiments.

FIG. 10 shows an overview flowchart for process 1000 for a caching tier in a storage system in accordance with at least one of the various embodiments. After a start block, at block 1002, in at least one of the various embodiments, a data file may be provided to a cache tier of the storage system. As discussed above, the data file may be provided to a storage system by way of one or more standard file system operations (e.g., write, PUT, save, or the like) initiated by a user or application.

At decision block 1004, in at least one of the various embodiments, if a version of the data file is in the cache store of the cache tier, control may flow block 1006; otherwise, control may flow to block 1008. In at least one of the various embodiments, if a data file is provided to the caching tier it will have a unique identifier. In at least one of the various embodiments, the composition of the identifier may include one or more of, a file path, filename, URI, GUID, hash value, or the like, or combination thereof. In at least one of the various embodiments, if a data file does not include a sufficiently unique identifier, the storage management application may be arranged to generate a unique identifier and associate it with the data file.

At block 1006, in at least one of the various embodiments, since a version of the data file is already in the cache store, that version may be updated to the current version (e.g., the incoming version) and moved to the beginning to the cache store. In at least one of the various embodiments, rather than moving the data file, the storage management application may reset the age of the data file to a value indicating that it is new to the cache store. Also, in at least one of the various embodiments, a new log record for I he incoming file may be recorded and the previous log record may be discarded, or marked as deleted.

In at least one of the various embodiments, a data file's position in a cache store may be moved to the front of the cache (reset to 'new') in response to requests to access the data file rather than just update the data file. Likewise, in at least one of the various embodiments, rather than moving the access data file in the cache, the storage management application may reset the age of the data file to a value indicating that it is new to the cache store. Next, control may be returned to a calling process.

At block 1008, in at least one of the various embodiments, since the data file is not currently in the cache store it may be added to the beginning of the cache store, or simply associated with an age value thru indicates it has just been added to the cache store. In at least one of the various embodiments, the storage management application may be arranged to store the data file onto one or more storage devices in the caching tier. Accordingly, references to the data files may be tracked using a separate queue, log files, or oilier data structure. Next, control may be returned to calling process.

Figure 11:
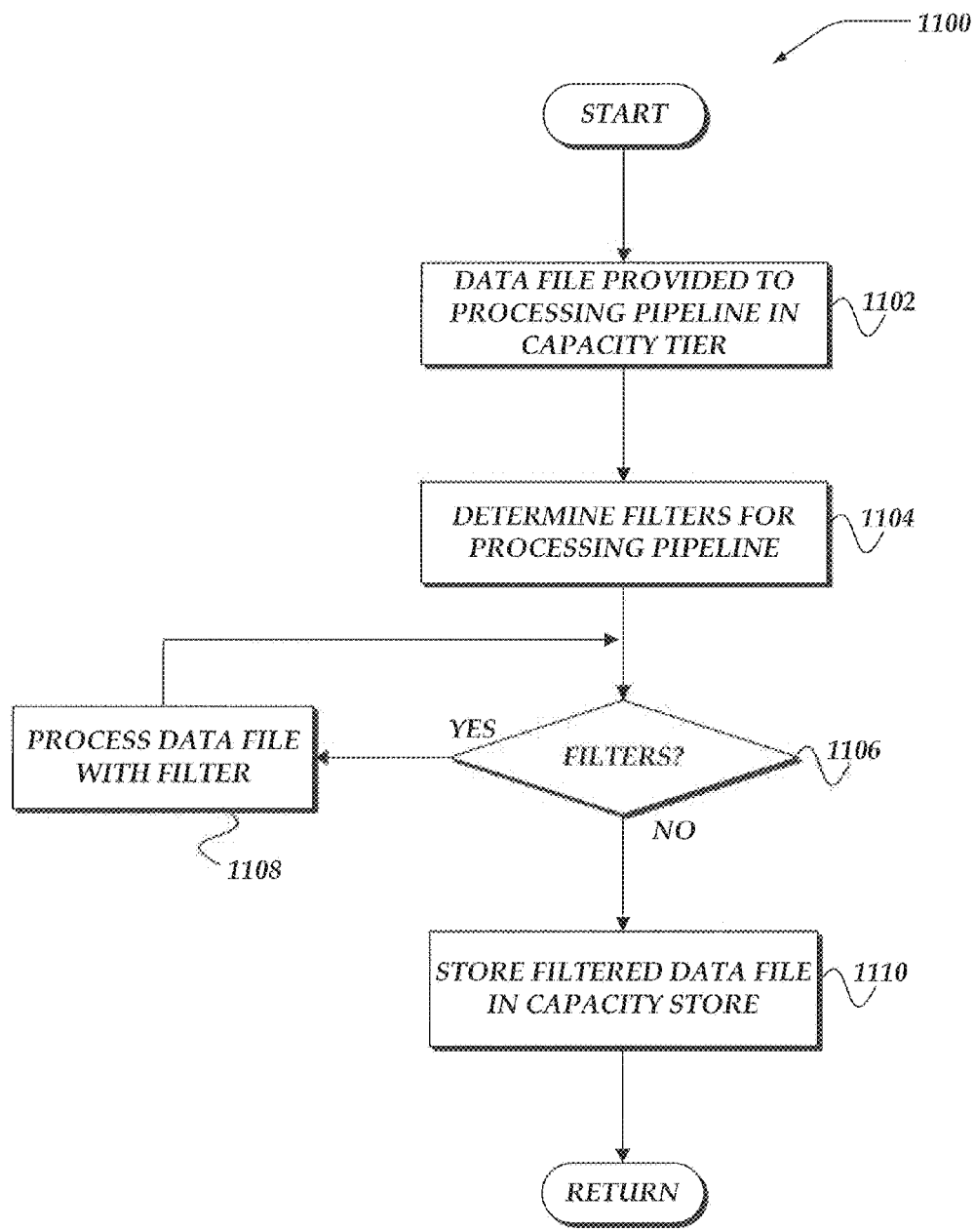
FIG. 11 shows an overview flowchart for a process for a processing pipeline in a storage system in accordance with at least one of the various embodiments.

FIG. 11 shows an overview flowchart for process 1100 for a processing pipeline in a storage system in accordance with at least one of the various embodiments. After a start block, at block 1102, in at least one of the various embodiments, a data file may be provided to a processing pipeline in a capacity tier of a storage system. In at least one of the various embodiments, the data file may be communicated to the processing pipeline over a network.

In at least one of the various embodiment, the processing pipeline may be implemented by a storage management application that is operative on a network computer. In at least one of the various embodiments, the processing pipeline may be operative on or more network computers that may be separate from the capacity tier. Or, in at least one of the various embodiments, the processing pipeline may be included as part of the capacity tier.

At block 1104, in at least one of the various embodiments, one or more filters for the processing pipeline may be determined. In at least one of the various embodiments, the particular filter that may be applied to a data file may vary depending on the configuration of the storage system. Also, in or least one of the various embodiments, some filters may be built-in filters provided by the storage system and some may be custom filters provided by a third party. Further, some filters may be mandatory and others may be optional.

In at least one of the various embodiments, a storage management application may be arranged to enable a user to register one or more filters to be applied to data files that are stored in the storage system. In at least one of the various embodiments, the registration of filters may include defining one or more rules for determining which filters should be applied to a given data file. In at least one of the various embodiments, these rules may be arranged tor matching filters to data files based on a variety of conditions, such as, ownership of the data file, name of the data files, location (e.g., path information), content type, data file size, or the like, or combination thereof. Also, in at least one of the various embodiments, rules for determining the filters in apply to a data file may be based on tags, and/or labels that may be associated with a data file.

In at least one of the various embodiments, the rules for determining filters may include various expressions that may include pattern matching, comparison operators, Boolean algebra, or the like. Also, in at least one of the various embodiments, rules for determining filters may be constructed using one or more programming languages, such as, Javascript, Java, Perl, Python, C, C++, C#, or the like, or combination thereof. Further, one or more custom and/or hybrid programming languages may be employed for generating rules for determining filters.

At decision block 1106, in at least one of the various embodiments, if are filters that remain to be executed in the pipeline, control may flow to block 1108; otherwise, control may flow to block 1110. In at least one of the various embodiments, each filter determined in block 1104 may be executed on the data file. In at least one of the various embodiments, a filter may be arranged to prevent the application of one or more other filters. For example, a filter may be arranged to identify a particular type of data file and prevent other filters from being applied to it. In such an example, not every filter may be applied to the data file.

At block 1108, in at least one of the various embodiments, the data file may be processed by the next available filter in the processing pipeline. Next, control may loop back to decision block 1106. In at least one of the various embodiments, a filter may be a hardware or software process that is enabled to access the contents and/or meta-data of the data file. Some filters may be arranged to transform the content of the data file. In at least one of the various embodiments, such transforms may include, but are not limited to, compression, decompression, encryption, decryption, audio processing, image scaling, video transcoding, translations, duplicating, optical character recognition, or the like.

Further, in at least one of the various embodiments, filters may be arranged to generate additional information based on the data file, such as, creating one or more indexes based on content or characteristics of the data file, adding meta data (e.g., tags), computing metrics/statistics, or the like. In at least one of the various embodiments, such additional information may be included as part of the data file (e.g., meta-data. tags, labels, or the like) or stored on another system, such as, as web server, database server, log files, or the like, or combination thereof.

In at least one of the various embodiments, the particular filter that may be applied to a data file may vary depend on the configuration of the storage system. Also, in at least one of the various embodiments, some filters may be built-in filters provided by the storage system and some may be custom filters provided by a third party. Further, in at least one of the various embodiments, some filters may be mandatory and others may be optional.

At block 1110, in at least one of the various embodiments, since the determined filters have been processed, the data file may be stored on storage in the capacity tier of the storage system. In at least one of the various embodiments, the data file may be communicated over a network to one or more storage computers that may comprise the capacity tier of a storage system. Also, in at least one of the various embodiments, one or more of the filter applied in block 1108 may have caused the data file to be discarded, discarded, or otherwise prevented from being communicated to the capacity tier of the storage system. Next, control may be returned to a calling process.

Figure 12:
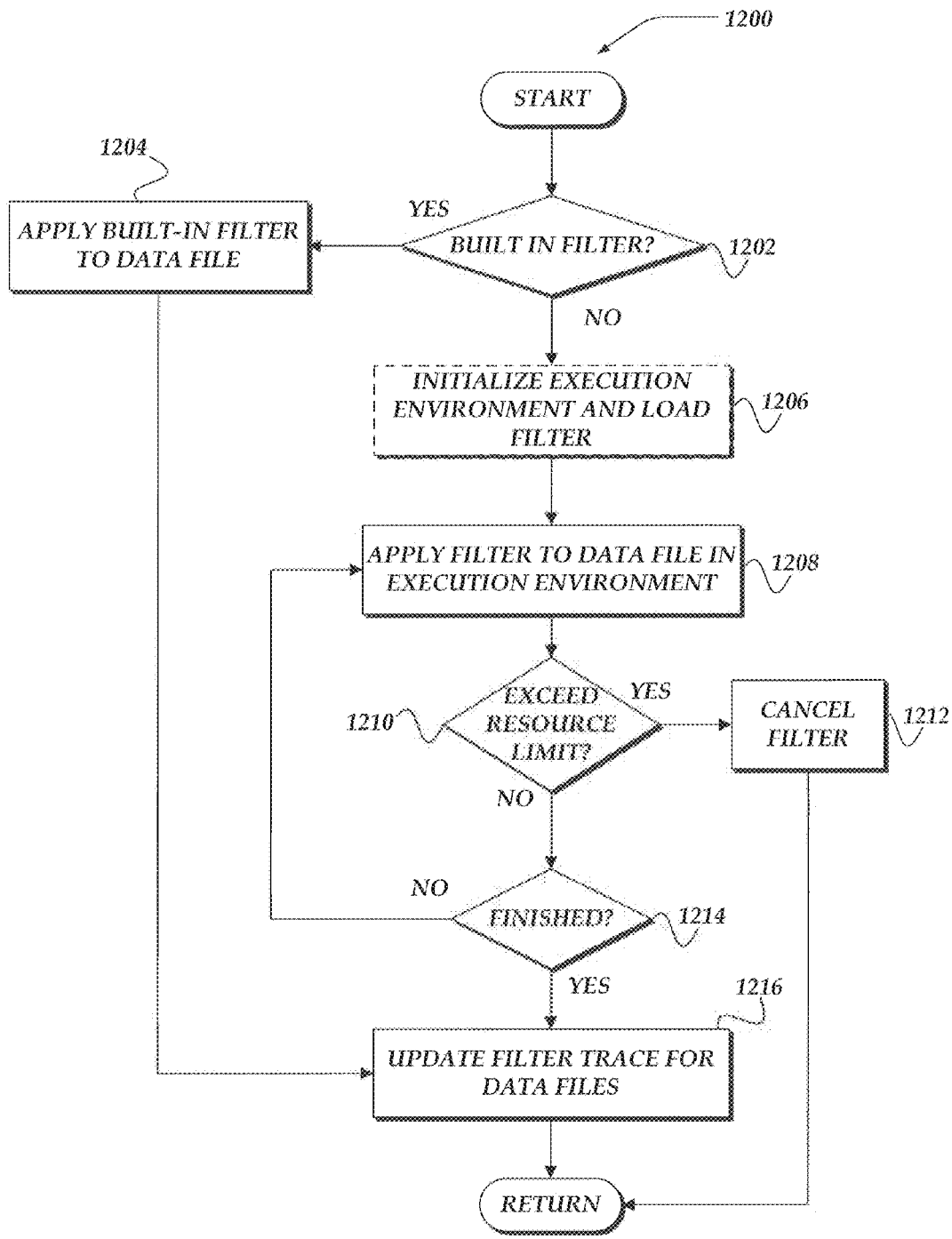
FIG. 12 shows an overview flowchart for a process for a pipeline processor in a storage system in accordance with at least one of the various embodiments.

FIG. 12 shows an overview flowchart for process 1200 for a pipeline processor in a storage system in accordance with at least one of the various embodiments. After a start block, at decision block 1202, if the current filter is a built-in filter control may flow to block 1204; otherwise, control may flow to block 1206.

In at least one of the various embodiments, built-in filters may be considered differently than non-built-in filters. For example, in at least one of the various embodiments, built-in filters may be considered to safer and/or more may have access to information and facilities of the storage system that may be unavailable for non-built-in filters. Further, in at least one of the various embodiments, built-in filters may be configured to have different timeouts and/or performance/resource quotas that non-built-in filters.

Also, in at least one of the various embodiments, for some built-in filters, resources required for executing the filters may be cached and/or initialized in advance. For example, in at least one of the various embodiments, one or more built-in filters may be arranged to be applied to each data file, accordingly, such filters may be pre-positioned or pre-initialized. Further, in at least one of the various embodiments, some built-in filters may allocated a known amount of resources to enable a predictable performance profile/response. However, in at least one of the various embodiments, built-in filters may be treated substantially than as non-built-in filters.

At block 1204, in at least one of the various embodiments, the built-in filter may be applied to the data file. In at least one of the various embodiments, built-in may include one or more tasks that may be integral to the operation and/or administration of the storage system. In at least one of the various embodiments, built-in filters may employed to generate metrics for evaluating the amount of data stored by a user or client application. For example, in at least one of the various embodiments, each time a data file is provided to a capacity tier, a built-in filter may be arranged to determine who the owns the data file and update then current storage balance based on the size of the data file. In at least one of the various embodiments, other built-in filters may include, data compression, erasure coding (for data protection), or the like.

In at least one of the various embodiments, built-in filters may be processed similarly to other filters. Accordingly, in at least one of the various embodiments, to actions performed for block 1204 may be performed at block 1206 and/or block 1208, as necessary. Next control may flow to block 1210.

At block 1206, optionally,, in at least one of the various embodiments, an execution environment may be initialized and the filter may be loaded and/or initialized in the execution environment. This block may be optional since these initialization steps may have occurred previously.

In at least one of the various embodiments, filters may be executed in an execution environment that is arranged to protect the various parts of the storage system from bad outcomes that may be caused by errant or otherwise broken filters. Various, well-known sandboxing techniques may be employed, such as executing the filter in a separate process that has limited permissions. In at least one of the various embodiments, each filter may be executed in a separate virtual machine. Further, in at least one of the various embodiments, each instance of a filter may be executed in a separate process and/or a separate virtual machine.

Also, in at least one of the various embodiments, the storage management application may be arranged to maintain queues of one or more filter execution environments that may be applied to executing filter operations. Thus, the initialization time and effort for spinning up an execution environment for a filter may be avoided depending on the availability of execution environments.

In at least one of the various embodiments, if an execution environment is available, the filter program, whether, it is a hardware application or software application, may undergo an initialization process. In some embodiments, this initialization process may include generic task operations, such as, compiling scripts or source code, allocating memory/buffers, resetting timers, establishing connections and/or exchanging handshakes with a storage management application or other storage computers, or the like, or combination thereof.

In at least one of the various embodiments, each filter may include one or more other initializations processes that may be related to the function and/or actions performed by the filter. In at least one of the various embodiments, this may include establishing connections and/or exchanging handshakes with one or more external applications, such as, databases, web servers, networks, opening files, or the like, or combination thereof.

At block 1208, in at least one of the various embodiments, the filter may be applied to the data file in the execution environment. In at least one of the various embodiment, the storage management application may communicate the data file to the execution environment that may be executing the filter. In at least one of the various embodiments, the filter may be provided the entire data file, in other cases, the filter may he provided meta-data and may subsequently request the contents of the data file if it is needed.

In at least one of the various embodiments, the filter may be implemented to employ one or more API methods that may be provided for accessing the data files and/or other facilities of the storage system.

In at least one of the various embodiments, filters may have arbitrary access to modify the data files they may enabled to access. For example, in at least one of the various embodiments, a user may register a custom filter to be applied to his or her data files. Accordingly, since the user owns the data file being stored the custom filter may arbitrarily modify the data file—accordingly to how it has been programmed.

In at least one of the various embodiments, filters may be arranged to perform a variety of tasks, as mentioned above.

Some filters may be arranged to transform the content of the data file. In at least one of the various embodiments, such transforms may include, but are not limited to, compression, decompression, encryption, decryption, audio processing, image scaling, video transcoding, translations, duplicating, optical character recognition, or the like.

Further, in at least one of the various embodiments, filters may be arranged to generate additional information based on the data file, such as, creating one or more indexes bayed on content or characteristics of the data file, adding meta data (e.g., tags), computing metrics/statistic, or the like.

At decision block 1210, in at least one of the various embodiments, if the execution of the filter exceeds one or more resource limits, control may flow to block 1212; otherwise, control may flow to decision block 1214.

In at least one of the various embodiments, a storage management application may be arranged to enforce various limits on filters, such as, CPU utilization limits, time-outs, quotas, or the like. In at least one of the various embodiments, limits may be one or more defined threshold values or threshold functions that trigger resource violation if they are exceeded.

At block 1212, in at least one of the various embodiments, since a resource violation has been triggered the current filter execution may be cancelled. In at least one of the various embodiments, one or more users may notified of the resource violation and/or an event log may be updated to record the occurrence.

In at least one of the various embodiments, the filter may be arranged to include one or more cleanup operations that may be executed as part of cancelling the filter. In at least one of the various embodiments, the cleanup operation may also be subject to resource limitations. In at least one of the various embodiments, if these resource limitations are exceeded, the filter may be immediately canceled. In at least one of the various embodiments, the cleanup operations may include one or more customized operations that may be related to the particular actions performed by the filter as well as generic cleanup operations. In at least one of the various embodiments, generic cleanup operations may include releasing memory, closing files, releasing network connections, or the like.

In at least one of the various embodiments, the storage management application may be arranged to canceling all filters for a given data file if one filter may be determined to exceed one or more resource limits. In at least one of the various embodiments, one or more of the filter may be cancelled and the original data file contents may be stored to the capacity tier.

At decision block 1214, in at least one of the various embodiments, if the application of the filter to the data file is finished, control may flow to block 1216; otherwise, in at least one of the various embodiments, control may loop bock to block 1208 for further processing. In at least one of the various embodiments, a filter may continue to execute until its actions have completed. Accordingly, in at least one of the various embodiments, depending on the how the filter is programmed it may have additional actions to perform.

At block 1216, in at least one of the various embodiments, the filter trace for the data file may be updated to indicate the last filter that was executed on the data file. In at least one of the various embodiments, each time a filter is applied to a data file, a record of which filter was applied may be generated and associated with the data file. See, FIG. 7 and its accompanying description for an example of a data structure that includes a filter trace.

In at least one of the various embodiments, the storage management application may be arranged to record sufficient information to enable the filters to be replayed in reverse order if necessary. Accordingly, in at least one of the various embodiments, the filter trace may include one or more properties, such as, an identifier of the filter, a version number of the filter, parameters and/or state information that may be relevant to the operation of the filter, or the like, or combination thereof. In some embodiments, the filter trace may include information provided by the filter itself for storing in the filter trace. Next, control may he returned to calling process.

Figure 13:
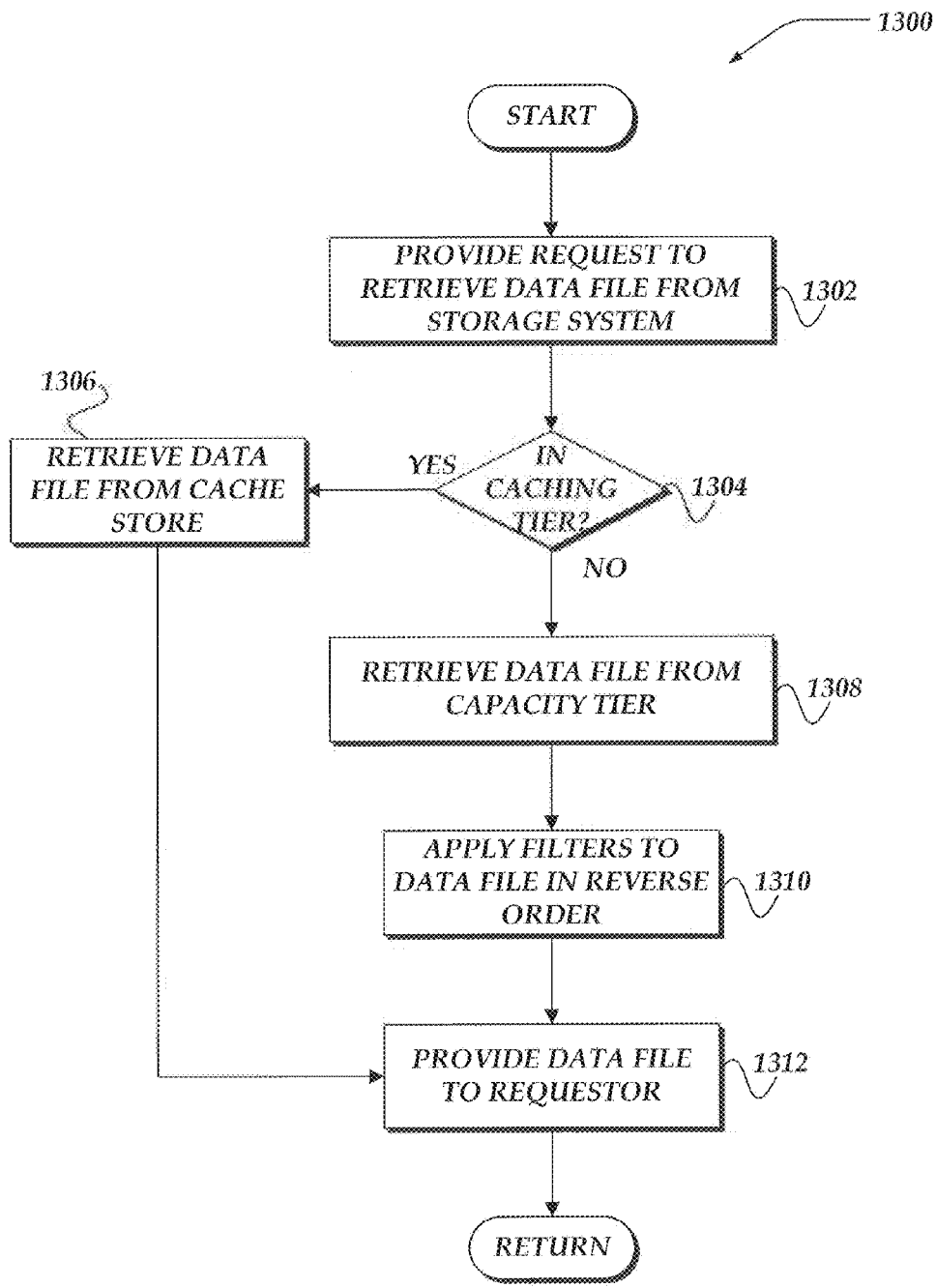
FIG. 13 shows an overview flowchart for a process for a read operation for extensible data paths in a storage system in accordance with at least one of the various embodiments.

FIG. 13 shows an overview flowchart for process 1300 for a read operation for extensible data paths in a storage system in accordance with at least one of the various embodiments. After a start block, at block 1302, in at least one of the various embodiments, a request to retrieve a data file may be provided to the storage system. At decision block 1304, in at least one of the various embodiments, if the data file is located in the caching tier, control may flow to block 1306; otherwise, control may flow to block 1308. At block 1306, in at least one of the various embodiments, since the data file is in the caching tier it may be retrieved from the cache store and next, control may flow to block 1312. At block 1308, in at least one of the various embodiments, since the data file is located in the capacity tier rather than the caching tier, the data file may be retrieved from the capacity tier.

At block 1310, in at least one of the various embodiments, the filters listed in the filter trace associated with the data file may he applied in reverse order as they were applied when the data file was saved to the capacity tier. In at least one of the various embodiments, the actual "reversing" operations that are performed may depend on the filter that was applied in the first place. In at least one of the various embodiments, each of the filters may be applied in the reverse order that they were previously applied to the data file.

In at least one of the various embodiments, some filters may not be reversible. For example, in at least one of the various embodiments, a filter that reformats an incoming image data file to a smaller size and discards the left over information (e.g., discards the original larger image file) may not be arranged try to enlarge the image data file. Instead, in this example, it may simply return the smaller image size. Thus, in this example, the filter may be arranged to do no operations in the reverse direction.

In contrast, in at least one of the various embodiments, a filter that was used to encrypt a data file, may be arranged to decrypt it as it is retrieved from the capacity tier. Accordingly, in at least one of the various embodiments, each filter may implement a reverse function/interface that may be executed as the data file is retrieved from the capacity tier.

In at least one of the various embodiments, the filters determined from the filter trace may be applied to the data file using a processing pipeline similar to the one shown in FIG. 6. However, the filters may be applied in the reverse order from how they were applied when the data file was saved to the capacity tier in the first place.

At block 1312, in at least one of the various embodiments, the data file may be provided to requestor. Next, in at least one of the various embodiments, control may be returned to a calling process.

It will be understood that figures, and combinations of actions in the flowchart-like illustrations, can he implemented by computer program instructions. These program instructions may be provided to a processor to produce a machine, such that the instructions executing on the processor create a means for implementing the actions specified in the flowchart blocks. The computer program instructions may be executed by a processor to cause a series of operational actions to be performed by the processor to produce a computer implemented process for implementing the actions specified in the flowchart block or blocks. These program instructions may be stored on some type of machine readable storage media, such as processor readable non-transitory storage media, or the like.

Accordingly, the illustrations support combinations of means for performing the specified actions, combinations of steps for performing the specified actions and program instruction means for performing the specified actions. It will also be understood that each block of the flowchart illustration, and combinations of blocks in the flowchart illustration, can be implemented by modules such as special purpose hardware systems which perform the specified actions or steps, or combinations of special purpose hardware and computer instructions.

What is claimed as new and desired to be protected by Letters Patent of the United States is:

1. A method for storing data in a storage system over a network using a network computer that executes instructions that perform actions, comprising:
    providing at least one data file to a caching tier in a storage system; and
    when a duration that the at least one data file remains in the caching tier exceeds a defined threshold, performing further actions, including:
        providing the at least one data file from the caching tier to a processing pipeline coupled to a capacity tier of the storage system;
        determining at least one filter to include in the processing pipeline based on at least a type of the at least one data file;
        updating the at least one data file based on iteratively applying each determined filter to the at least one data file in the processing pipeline;
        when a filter that is being cumulatively applied to the at least one data file exceeds a resource limit based on one or more defined threshold values that trigger resource violation during its application to the at least one data file,. canceling the application of the filter; and
        storing each updated data file in the capacity tier of the storage system.

2. The method of claim 1, wherein providing the at least one data file to the caching tier further comprises, if the at least one data file is currently stored in the caching tier, resetting an age to new for the at least one data file currently stored in the caching tier.

3. The method of claim 1, wherein providing the at least one data file to the caching tier further comprises, communicating an acknowledgment to the network computer that provided the at least one data file, wherein the acknowledgment at least indicates that the at least one data file is currently stored in the caching tier.

4. The method of claim 1, further comprising, generating at least one index based on the applying of the at least one determined filter to the at least one data file.

5. The method of claim 1, further comprising, updating a filter trace that is associated with the at least one data file to include at least an identifier that corresponds to each filter that is applied to the at least one data file.

6. The method of claim 1, wherein updating the at least one data file based on applying each determined filter, further comprises, at least one of compressing the at least one data file or encrypting the at least one data file.

7. The method of claim 1, further comprising, responsive to a request to retrieve the at least one data file from the capacity tier of the storage system, applying each of the filters in a reverse order that they were previously applied to the at least one data file that was stored in the capacity tier of the storage system.

8. The method of claim 1, further comprising, initializing an execution environment for each determined filter that is at least one of a virtual machine or a process for applying the at least one data file.

9. A system for storing data in a storage system over a network, comprising:
   a client computer, comprising:
      a transceiver that is operative to communicate over the network;
      a memory that is operative to store at least instructions; and
      a processor device that is operative to execute instructions that enable actions, including:
         providing at least one data file to a caching tier in a storage system; and
   a network computer comprising:
      a transceiver that is operative to communicate over the network;
      a memory that is operative to store at least instructions; and
      a processor device that is operative to execute instructions that enable actions, including:
         when a duration that the at least one data file remains in the caching tier exceeds a defined threshold, performing further actions, including:
            providing the at least one data file from the caching tier to a processing pipeline coupled to a capacity tier of the storage system;
            determining at least one filter to include in the processing pipeline based on at least a type of the at least one data file;
            updating the at least one data file based on iteratively applying each determined filter to the at least one data file in the processing pipeline,.
            when a filter that is being cumulatively applied to the at least one data file exceeds a resource limit based on one or more defined threshold values that trigger resource violation during its application to the at least one data file, canceling the application of the filter; and
            storing each updated data file in the capacity tier of the storage system.

10. The system of claim 9, wherein providing the at least one data file to the caching tier further comprises, if the at least one data file is currently stored in the caching tier, resetting an age to new for the at least one data file currently stored in the caching tier.

11. The system of claim 9, wherein providing the at least one data file to the caching tier further comprises, communicating an acknowledgment to the network computer that provided the at least one data file, wherein the acknowledgment at least indicates that the at least one data file is currently stored in the caching tier.

12. The system of claim 9, wherein the network computer processor device is operative to enable actions, further comprising, generating at least one index based on the applying of the at least one determined filter to the at least one data file.

13. The system of claim 9, wherein the network computer processor device is operative to enable actions, further comprising, updating a filter trace that is associated with the at least one data file to include at least an identifier that corresponds to each filter that is applied to the at least one data file.

14. The system of claim 9, wherein updating the at least one data file based on applying each determined filter, further comprises, at least one of compressing the at least one data file or encrypting the at least one data file.

15. The system of claim 9, wherein the network computer processor device is operative to enable actions, further comprising, responsive to a request to retrieve the at least one data file from the capacity tier of the storage system, applying each of the filters in a reverse order that they were previously applied to the at least one data file that was stored in the capacity tier of the storage system.

16. The system of claim 9, wherein the network computer processor device is operative to enable actions, further comprising, initializing an execution environment for each determined filter that is at least one of a virtual machine or a process for applying the at least one data file.

17. A processor readable non transitive non-transitory storage media that includes instructions for storing data in a storage system over a network, wherein execution of the instructions by a processor device enables actions, comprising:
   providing at least one data file to a caching tier in a storage system; and
   when a duration that the at least one data file remains in the caching tier exceeds a defined threshold, performing further actions, including:
      providing the at least one data file from the caching tier to a processing pipeline coupled to a capacity tier of the storage system;
      determining at least one filter to include in the processing pipeline based on at least a type of the at least one data file;
      updating the at least one data file based on iteratively applying each determined filter to the at least one data file in the processing pipeline,.
      when a filter that is being cumulatively applied to the at least one data file exceeds a resource limit based on one or more defined threshold values that trigger resource violation during its application to the at least one data file, canceling the application of the filter; and
      storing each updated data file in the capacity tier of the storage system.

18. The media of claim 17, wherein providing the at least one data file to the caching tier further comprises, if the at least one data file is currently stored in the caching tier, resetting an age to new for the at least one data file currently stored in the caching tier.

19. The media of claim 17, wherein providing the at least one data file to the caching tier further comprises, communicating an acknowledgment to the network computer that provided the at least one data file, wherein the acknowledgment at least indicates that the at least one data file is currently stored in the caching tier.

20. The media of claim 17, further comprising, generating at least one index based on the applying of the at least one determined filter to the at least one data file.

21. The media of claim 17, further comprising, updating a filter trace that is associated with the at least one data file to include at least an identifier that corresponds to each filter that is applied to the at least one data file.

22. The media of claim 17, wherein updating the at least one data file based on applying each determined filter, further comprises, at least one of compressing the at least one data file or encrypting the at least one data file.

23. The media of claim 17, further comprising, responsive to a request to retrieve the at least one data file from the capacity tier of the storage system, applying each of the filters in a reverse order that they were previously applied to the at least one data file that was stored in the capacity tier of the storage system.

24. A network computer that is operative for storing data in a storage system over a network using a network, comprising:
   a transceiver that is operative to communicate over a network;
   a memory that is operative to store at least instructions; and
   a processor device that is operative to execute instructions that enable actions, including:
      providing at least one data file to a caching tier in a storage system; and
      when a duration that the at least one data file remains in the caching tier exceeds a defined threshold, performing further actions, including:
         providing the at least one data file from the caching tier to a processing pipeline coupled to a capacity tier of the storage system;
         determining at least one filter to include in the processing pipeline based on at least a type of the at least one data file;
         updating the at least one data file based on iteratively applying each determined filter to the at least one data file in the processing pipeline;
         when a filter that is being cumulatively applied to the at least one data file exceeds a resource limit based on one or more defined threshold values that trigger resource violation during its application to the at least one data file,. canceling the application of the filter; and
         storing each updated data file in the capacity tier of the storage system.

25. The network computer of claim 24, wherein providing the at least one data file to the caching tier further comprises, if the at least one data file is currently stored in the caching tier, resetting an age to new for the at least one data file currently stored in the caching tier.

26. The network computer of claim 24, wherein providing the at least one data file to the caching tier further comprises, communicating an acknowledgment to the network computer that provided the at least one data file, wherein the acknowledgment at least indicates that the at least one data file is currently stored in the caching tier.

27. The network computer of claim 24, wherein the network computer processor device is operative to enable actions, further comprising, generating at least one index based on the applying of the at least one determined filter to the at least one data file.

28. The network computer of claim 24, wherein the network computer processor device is operative to enable actions, further comprising, updating a filter trace that is associated with the at least one data file to include at least an identifier that corresponds to each filter that is applied to the at least one data file.

29. The network computer of claim 24, wherein updating the at least one data file based on applying each determined filter, further comprises, at least one of compressing the at least one data file or encrypting the at least one data file.

30. The network computer of claim 24, wherein the network computer processor device is operative to enable actions, further comprising, responsive to a request to retrieve the at least one data file from the capacity tier of the storage system, applying each of the filters in a reverse order that they were previously applied to the at least one data file that was stored in the capacity tier of the storage system.

\* \* \* \* \*

UNITED STATES PATENT AND TRADEMARK OFFICE
CERTIFICATE OF CORRECTION

PATENT NO. : 9,053,114 B1  
APPLICATION NO. : 14/454651  
DATED : June 9, 2015  
INVENTOR(S) : Lemar et al.

Page 1 of 4

It is certified that error appears in the above-identified patent and that said Letters Patent is hereby corrected as shown below:

In the specification

In Column 2, Line 17, delete "otherwise," and insert -- otherwise. --, therefor.

In Column 2, Line 28, delete "being bused" and insert -- being based --, therefor.

In Column 2, Line 37, delete "apparatus tor" and insert -- apparatus for --, therefor.

In Column 2, Line 52, delete "memory." and insert -- memory, --, therefor.

In Column 3, Line 13, delete "custom,," and insert -- custom, --, therefor.

In Column 3, Line 31, delete "may he" and insert -- may be --, therefor.

In Column 3, Line 32, delete "may he" and insert -- may be --, therefor.

In Column 3, Line 40, delete "text tiles," and insert -- text files, --, therefor.

In Column 3, Line 65, delete "the fitter" and insert -- the filter --, therefor.

In Column 4, Line 4, delete "data tiles" and insert -- data files --, therefor.

In Column 4, Line 35, delete "may he" and insert -- may be --, therefor.

In Column 5, Line 32, delete "107-105" and insert -- 102-105 --, therefor.

In Column 5, Line 58, delete "that identities" and insert -- that identifies --, therefor.

In Column 6, Line 37, delete "Mobil communication" and insert -- Mobile communication --, therefor.

In Column 6, Line 51, delete "102 105" and insert -- 102-105 --, therefor.

In the specification

Signed and Sealed this  
Sixteenth Day of August, 2016

Michelle K. Lee  
*Director of the United States Patent and Trademark Office*

CERTIFICATE OF CORRECTION (continued)
U.S. Pat. No. 9,053,114 B1

In Column 7, Line 52, delete "arc also" and insert -- are also --, therefor.

In Column 7, Line 61, delete "represent tor" and insert -- represent, for --, therefor.

In Column 7, Line 66, delete "(CPU)," and insert -- (CPU). --, therefor.

In Column 8, Line 18, delete "WGDMA," and insert -- WCDMA, --, therefor.

In Column 8, Line 27, delete "to province" and insert -- to produce --, therefor.

In Column 8, Line 37, delete "such its" and insert -- such as --, therefor.

In Column 8, Line 43, delete "n status" and insert -- a status --, therefor.

In Column 8, Line 52, delete "in respond" and insert -- in response --, therefor.

In Column 8, Lines 56-57, delete "interlace 246" and insert -- interface 246 --, therefor.

In Column 8, Line 60, delete "any oilier" and insert -- any other --, therefor.

In Column 9, Line 5, delete "interlace 250" and insert -- interface 250 --, therefor.

In Column 9, Line 24, delete "may he" and insert -- may be --, therefor.

In Column 11, Lines 6-7, delete "interlace 332" and insert -- interface 332 --, therefor.

In Column 11, Line 29, delete "such us" and insert -- such as --, therefor.

In Column 11, Line 55, delete "may he" and insert -- may be --, therefor.

In Column 12, Line 1, delete "solid stale" and insert -- solid state --, therefor.

In Column 12, Line 17, delete "programs." and insert -- programs, --, therefor.

In Column 12, Line 57, delete "may he" and insert -- may be --, therefor.

In Column 13, Line 12, delete "data tiles" and insert -- data files --, therefor.

In Column 13, Line 15, delete "track length," and insert -- track the length --, therefor.

In Column 13, Line 16, delete "data tiles" and insert -- data files --, therefor.

In Column 13, Line 24, delete "data tiles" and insert -- data files --, therefor.

In Column 13, Line 35, delete "of die" and insert -- of the --, therefor.

In Column 14, Line 3, delete "tor storage." and insert -- for storage. --, therefor.

In Column 14, Line 11, delete "optical," and insert -- optical --, therefor.

In the specification

In Column 14, Line 16, delete "she data" and insert -- the data --, therefor.

In Column 14, Lines 47-48, delete "date structure 700 tor" and insert -- data structure 700 for --, therefor.

In Column 14, Line 52, delete "date file" and insert -- data file --, therefor.

In Column 15, Line 54, delete "1200 and" and insert -- 1200, and --, therefor.

In Column 16, Line 22, delete "RFC," and insert -- RPC, --, therefor.

In Column 16, Line 44, delete "data tile." and insert -- data file. --, therefor.

In Column 16, Line 48, delete "stated tor" and insert -- stated for --, therefor.

In Column 16, Line 54, delete "eligible tor" and insert -- eligible for --, therefor.

In Column 16, Line 64, delete "data tiles" and insert -- data files --, therefor.

In Column 17, Line 30, delete "to identity" and insert -- to identify --, therefor.

In Column 17, Line 32, delete "may he" and insert -- may be --, therefor.

In Column 17, Line 46, delete "one or move," and insert -- one or more --, therefor.

In Column 18, Line 36, delete "for I he" and insert -- for the --, therefor.

In Column 18, Line 51, delete "value thru" and insert -- value that --, therefor.

In Column 18, Line 56, delete "oilier data" and insert -- other data --, therefor.

In Column 18, Line 66, delete "embodiment," and insert -- embodiments, --, therefor.

In Column 19, Line 12, delete "or least" and insert -- at least --, therefor.

In Column 19, Line 23, delete "arranged tor" and insert -- arranged for --, therefor.

In Column 19, Line 28, delete "filters in" and insert -- filters to --, therefor.

In Column 20, Line 3, delete "meta-data." and insert -- meta-data, --, therefor.

In Column 20, Line 64, delete "update then" and insert -- update their --, therefor.

In Column 21, Line 5, delete "Next" and insert -- Next, --, therefor.

In Column 21, Line 6, delete "optionally,," and insert -- optionally, --, therefor.

In Column 21, Line 48, delete "embodiment," and insert -- embodiments, --, therefor.

In the specification

CERTIFICATE OF CORRECTION (continued)
U.S. Pat. No. 9,053,114 B1

In Column 21, Line 53, delete "may he" and insert -- may be --, therefor.

In Column 22, Line 9, delete "bayed on" and insert -- based on --, therefor.

In Column 22, Line 55, delete "loop bock" and insert -- loop back --, therefor.

In Column 23, Line 11, delete "may he" and insert -- may be --, therefor.

In Column 23, Line 30, delete "may he" and insert -- may be --, therefor.

In Column 23, Line 63, delete "can he" and insert -- can be --, therefor.

In the claims

In Column 24, Line 42, in Claim 1, delete "data file,." and insert -- data file, --, therefor.

In Column 25, Line 41, in Claim 9, delete "pipeline,." and insert -- pipeline; --, therefor.

In Column 26, Line 19, in Claim 17, delete "readable non transitive" and insert -- readable --, therefor.

In Column 26, Line 37, in Claim 17, delete "pipeline,." and insert -- pipeline; --, therefor.

In Column 27, Line 32, in Claim 24, delete "data file,." and insert -- data file, --, therefor.